(12) United States Patent
Lai et al.

(10) Patent No.: US 11,854,786 B2
(45) Date of Patent: Dec. 26, 2023

(54) DEEP LINES AND SHALLOW LINES IN SIGNAL CONDUCTING PATHS

(71) Applicant: TAIWAN SEMICONDUCTOR MANUFACTURING COMPANY, LTD., Hsinchu (TW)

(72) Inventors: Wei-An Lai, Hsinchu (TW); Te-Hsin Chiu, Hsinchu (TW); Shih-Wei Peng, Hsinchu (TW); Wei-Cheng Lin, Hsinchu (TW); Jiann-Tyng Tzeng, Hsinchu (TW); Chia-Tien Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 284 days.

(21) Appl. No.: 17/344,530

(22) Filed: Jun. 10, 2021

(65) Prior Publication Data

US 2022/0262719 A1    Aug. 18, 2022

Related U.S. Application Data

(60) Provisional application No. 63/148,883, filed on Feb. 12, 2021.

(51) Int. Cl.
*H01L 23/528* (2006.01)
*H01L 21/768* (2006.01)
*H01L 23/522* (2006.01)

(52) U.S. Cl.
CPC ...... *H01L 23/528* (2013.01); *H01L 21/76802* (2013.01); *H01L 21/76877* (2013.01); *H01L 23/5226* (2013.01)

(58) Field of Classification Search
CPC ............ H01L 23/528; H01L 21/76802; H01L 21/76877; H01L 23/5226; H01L 23/5222; H01L 23/5283; H01L 21/76807; H01L 27/0207; H01L 21/76895; H01L 21/76816
See application file for complete search history.

(56) References Cited

U.S. PATENT DOCUMENTS

| 7,260,442 | B2 | 8/2007 | Hwang et al. |
| 9,256,709 | B2 | 2/2016 | Yu et al. |
| 2012/0193785 | A1 | 8/2012 | Lin et al. |
| 2014/0040838 | A1 | 2/2014 | Liu et al. |
| 2015/0278429 | A1 | 10/2015 | Chang |
| 2016/0358967 | A1* | 12/2016 | Madurawe ........ H01L 27/14636 |
| 2021/0407907 | A1* | 12/2021 | Yoo ................... H01L 23/53228 |

FOREIGN PATENT DOCUMENTS

| TW | 201742228 | 12/2017 |
| TW | 202022950 | 6/2020 |

* cited by examiner

*Primary Examiner* — Karen Kusumakar
(74) *Attorney, Agent, or Firm* — Hauptman Ham, LLP

(57) ABSTRACT

An integrated circuit includes a plurality of first layer deep lines and a plurality of first layer shallow lines. The integrated circuit also includes a plurality of second layer deep lines and a plurality of second layer shallow lines. Each of the first layer deep lines and the first layer shallow lines is in a first conductive layer. Each of the second layer deep lines and the second layer shallow lines is in a second conductive layer above the first conductive layer.

20 Claims, 22 Drawing Sheets

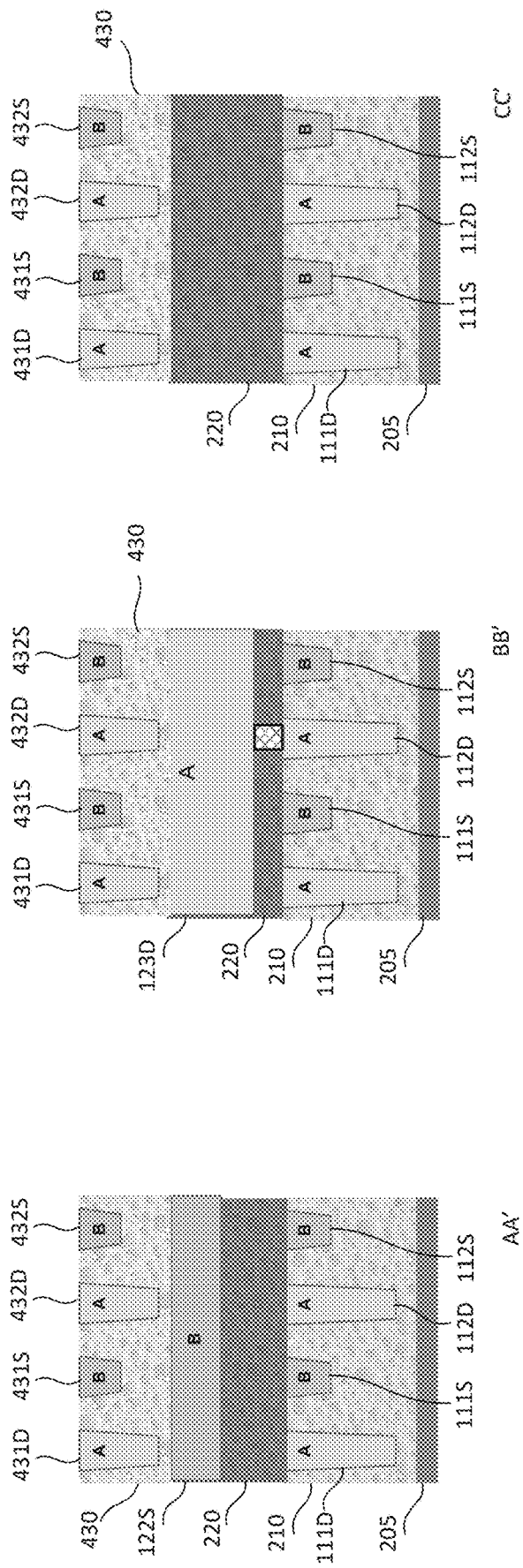

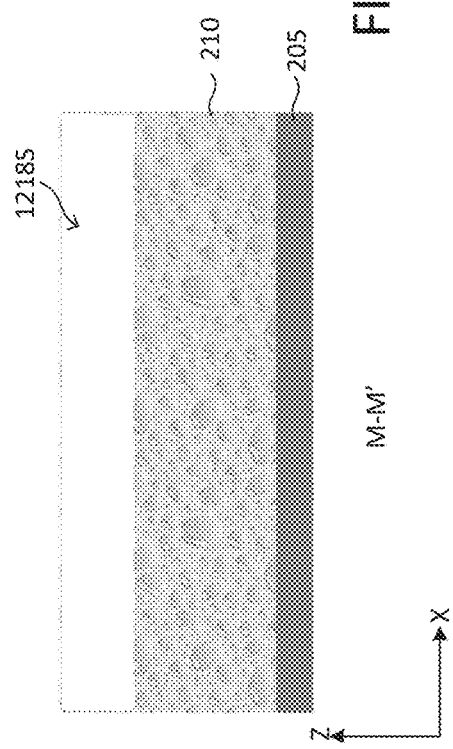
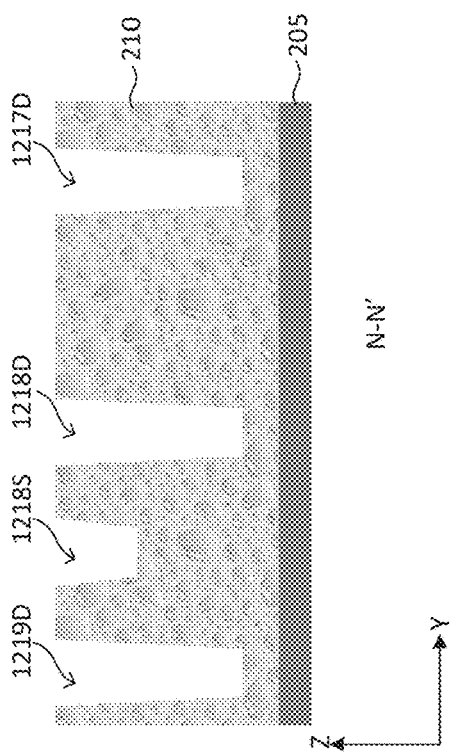
FIG. 12A
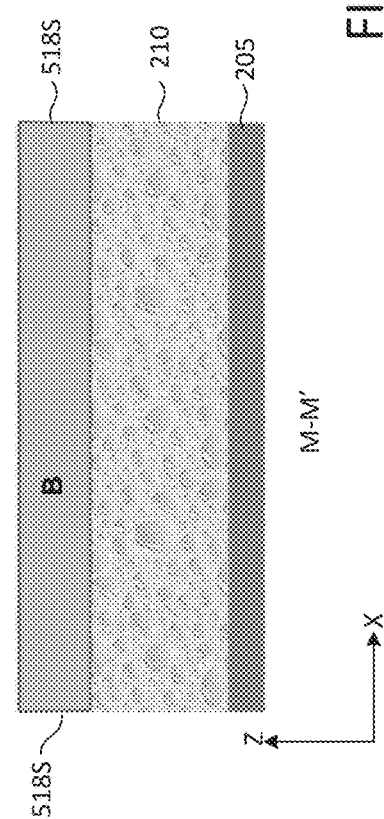
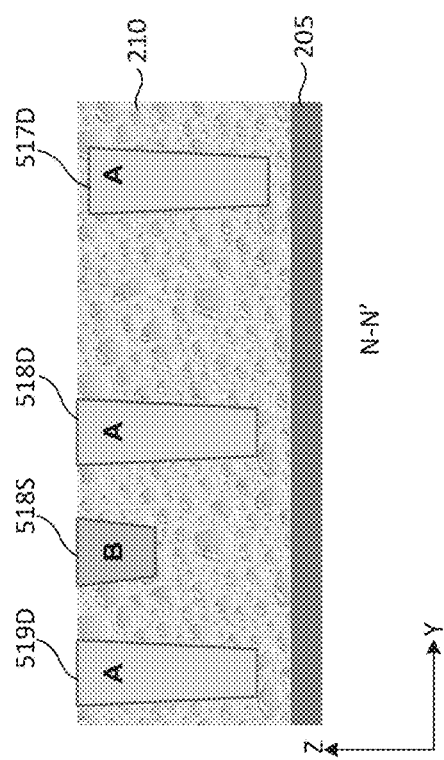
FIG. 12B

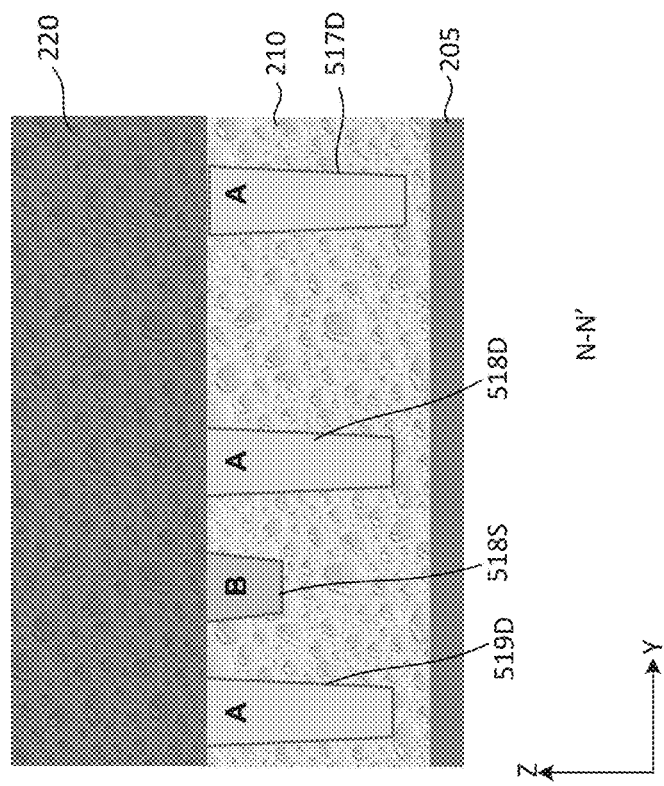
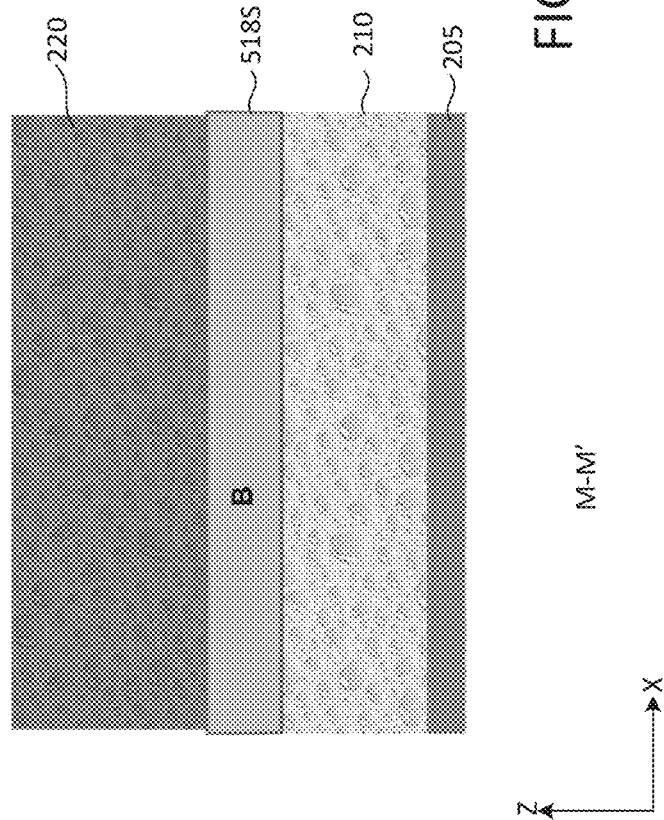
FIG. 12C

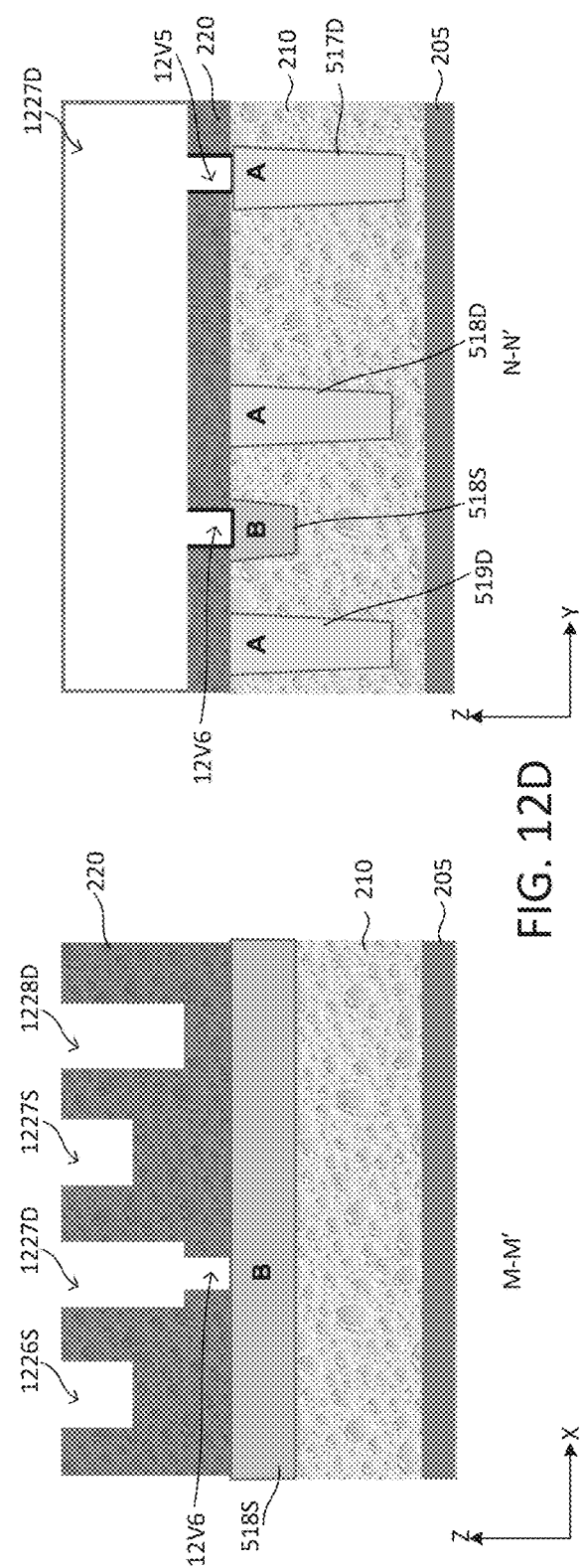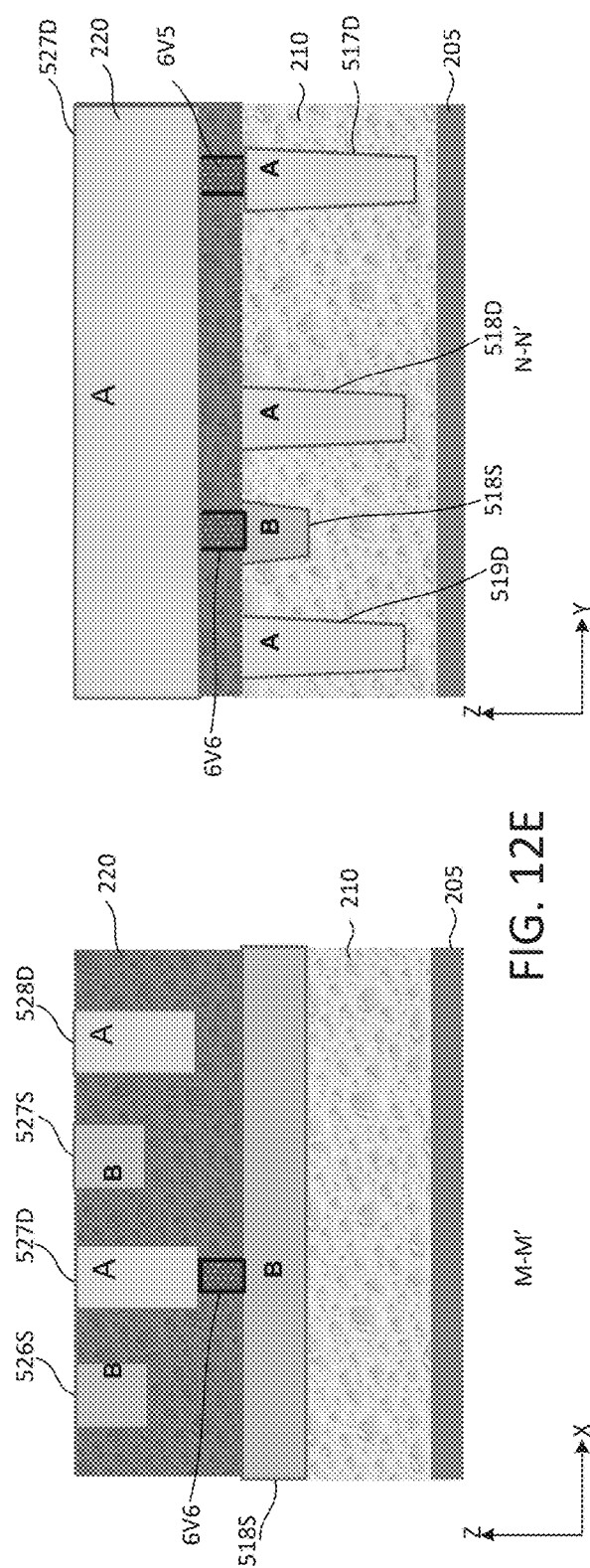
FIG. 12D
FIG. 12E

DEEP LINES AND SHALLOW LINES IN SIGNAL CONDUCTING PATHS

PRIORITY CLAIM AND CROSS-REFERENCE

The present application claims the priority of U.S. Provisional Application No. 63/148,883, filed Feb. 12, 2021, which is incorporated herein by reference in its entirety.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or low for clarity of discussion.

FIGS. 4A-4C are cross-sectional views of the integrated circuit in FIG. 1, in accordance with some embodiments.

FIGS. 12A-12E are cross-sectional views of example device structures, in accordance with some embodiments.

DETAILED DESCRIPTION

Figure 1:
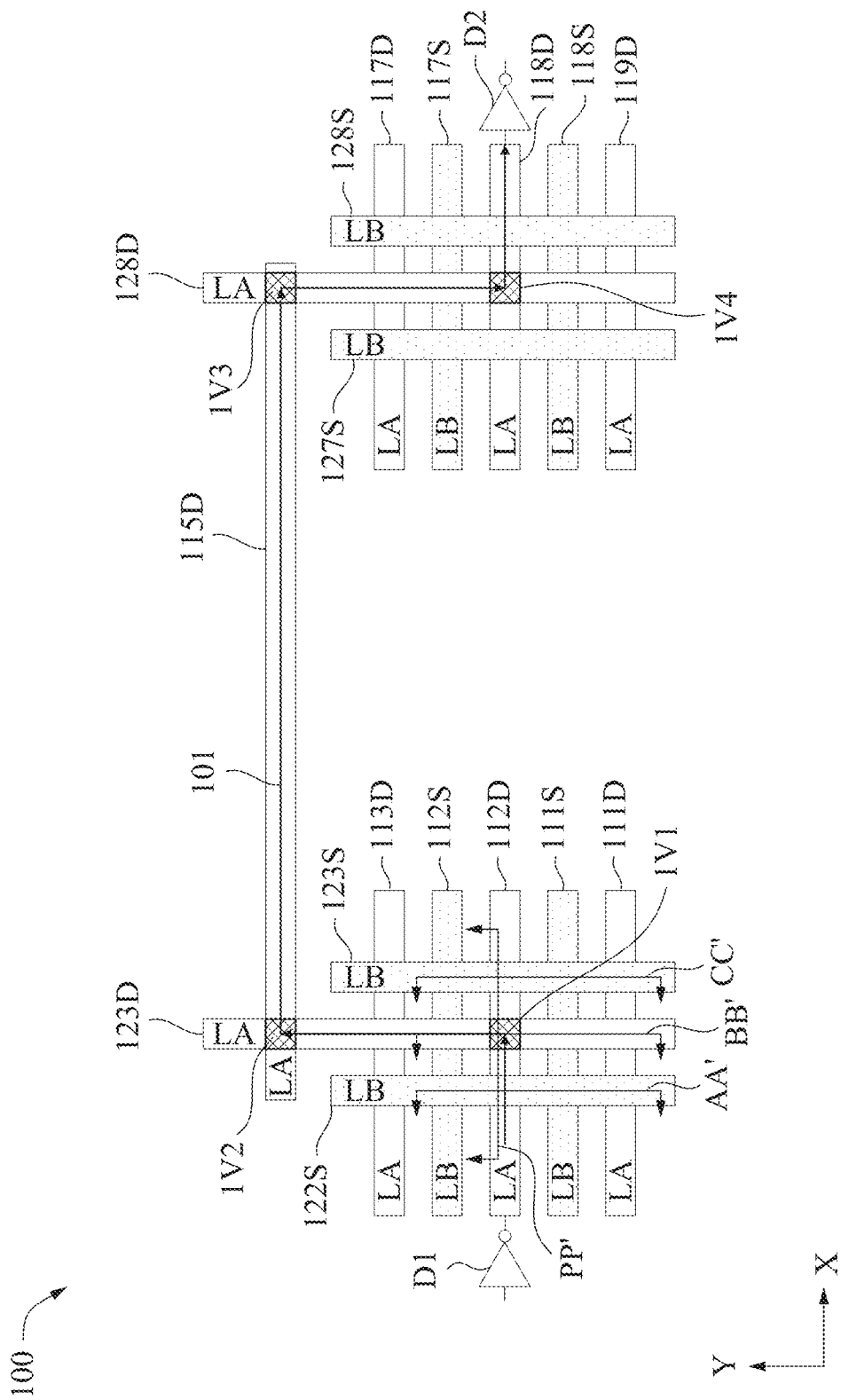
FIG. 1 is a layout diagram of an integrated circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an integrated circuit includes deep lines and shallow lines in both a first conductive layer and a second conductive layer. The selection of the deep lines and shallow lines for constructing various signal conducting paths allow performance improvements for the integrated circuit. In some embodiments, the resistance capacitance (RC) constant of the signal conducting path from a first active device to a second active device is reduced. In some embodiments, the time delay of the signal propagation in the signal conducting path from a first active device to a second active device is reduced. In some embodiments, the signal conducting path includes a mutation point between a low resistivity portion of the signal conducting path and a low capacitivity portion of the signal conducting path. In some embodiments, the signal conducting path changes from a deep line to a shallow line at the mutation point. In some embodiments, the signal propagation time delay in a signal conducting path from a first active device to a second active device is reduced when a mutation point is selected from several mutation point candidates on the signal conducting path.

FIG. 1 is a layout diagram of an integrated circuit 100, in accordance with some embodiments. FIGS. 2A-2D are cross-sectional views of the integrated circuit in FIG. 1, in accordance with some embodiments. The integrated circuit 100 includes first layer deep lines and first layer shallow lines extending in the X-direction. The integrated circuit 100 also includes second layer deep lines and second layer shallow lines extending in the Y-direction. The first layer deep lines (111D, 112D, 113D, 115D, 117D, 118D, and 119D) and the first layer shallow lines (111S, 112S, 117S, and 118S) are in a first conductive layer. The second layer deep lines (123D and 128D) and the second layer shallow lines (122S, 123S, 127S, and 128S) are in a second conductive layer.

The integrated circuit 100 includes a first active device D1 and a second active device D2. The output of the first active device D1 is electrically connected to an input of the second active device D2 through a conducting path 101. The conducting path 101 includes segments of the first layer deep line 112D, the second layer deep line 123D, the first layer deep line 115D, the second layer deep line 128D, and the first layer deep line 118D. The via-connector 1V1 electrically connects the first layer deep line 112D with the second layer deep line 123D. The via-connector 1V2 electrically connects the second layer deep line 123D with the first layer deep line 115D. The via-connector 1V3 electrically connects the first layer deep line 115D with the second layer deep line 128D. The via-connector 1V4 electrically connects the second layer deep line 128D with the first layer deep line 118D. The output of the first active device D1 is electrically connected to the first layer deep line 112D, and the input of the second active device D2 is electrically connected to the first layer deep line 118D.

In FIG. 1, the conducting path 101 includes the first layer deep lines and the second layer deep lines, while the conducting path 101 excludes the first layer shallow lines and the second layer shallow lines. That is, the first layer shallow lines and the second layer shallow lines are absent from the conducting path 101. The resistive value of a first layer deep line per unit length is smaller than the resistive value of a first layer shallow line per unit length, while the capacitive value of a first layer deep line per unit length is larger than the capacitive value of a first layer shallow line per unit length. Similarly, the resistive value of a second layer deep line per unit length is smaller than the resistive value of a second layer shallow line per unit length, while the capacitive value of a second layer deep line per unit length is larger than the capacitive value of a second layer shallow line per unit length. The geometric distinctions between the first layer deep lines and the first layer shallow lines are recognizable in the cross-sectional views of FIGS. 2A-2D. The geometric distinctions between the second layer deep lines and the second layer shallow lines are also recognizable in the cross-sectional views of FIGS. 2A-2D.

Figure 2A:
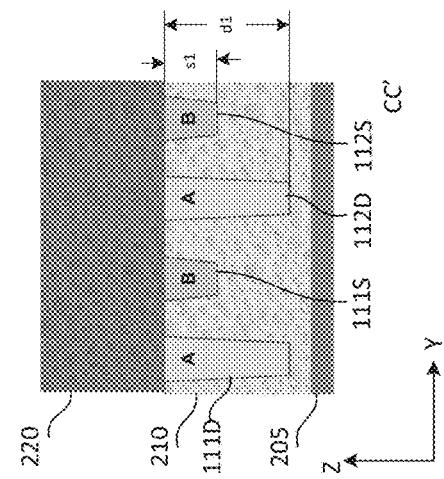
FIGS. 2A-2D are cross-sectional views of integrated circuit in FIG. 1, in accordance with some embodiments.
Figure 2B:
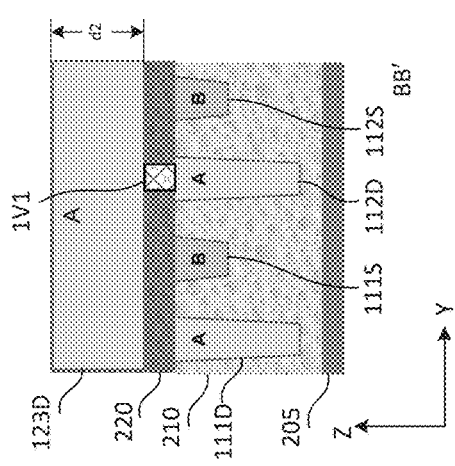
Figure 2C:
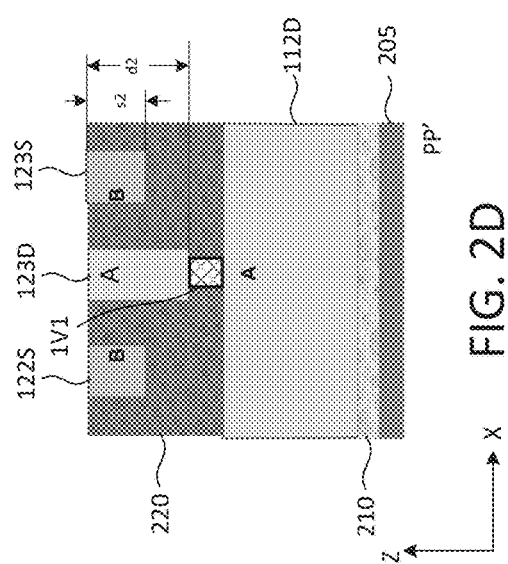

The cross-sectional views of integrated circuit 100 in cutting planes as specified by the lines AA', BB', and CC' in FIG. 1 are correspondingly depicted in FIG. 2A, FIG. 2B, and FIG. 2C. In FIGS. 2A-2C, the first layer deep lines 111D and 112D and the first layer shallow lines 111S and 112S are deposited above an insulation layer 205. Each of the first layer deep lines 111D and 112D extends into the interlayer dielectric 210 with the depth d1 along the Z-direction. Each of the first layer shallow lines 111S and 112S extends into the interlayer dielectric 210 with the depth s1 along the Z-direction. The depth d1 of the first layer deep lines is larger than the depth s1 of the first layer shallow lines.

In FIGS. 2A-2C, the interlayer dielectric 220 is deposited above the interlayer dielectric 210 and above the first layer deep lines and the first layer shallow lines. In FIG. 2A, the second layer shallow line 122S extends along the Y-direction and is embedded in the interlayer dielectric 220 with the depth s2. In FIG. 2B, the second layer deep line 123D extends along the Y-direction and is embedded in the interlayer dielectric 220 with the depth d2. Furthermore, the second layer deep line 123D is electrically connected to the first layer deep line 112D through the via-connector 1V1. In FIG. 2C, the cross-sections of the second layer deep lines and the second layer shallow lines do not appear in the cross-sectional view along the cutting plane as specified by the line CC' of FIG. 1.

Figure 2D:
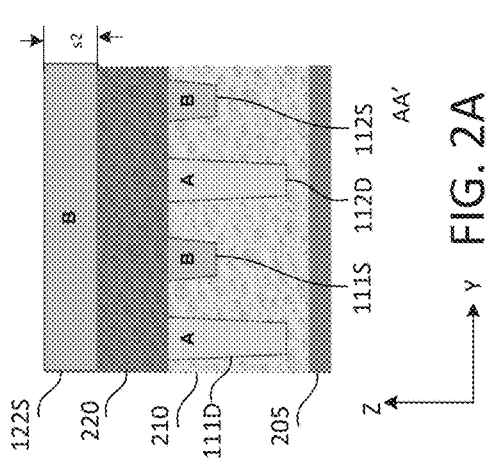

The cross-sectional view of integrated circuit 100 in cutting plane as specified by the line PP' in FIG. 1 is depicted in FIG. 2D. In FIG. 2D, the second layer deep line 122D and the second layer shallow lines 122S and 123S are deposited above the interlayer dielectric 210. The second layer deep line 123D extends into the interlayer dielectric 220 with the depth d2 along the Z-direction. Each of the second layer shallow lines 122S and 123S extends into the interlayer dielectric 220 with the depth s2 along the Z-direction. The depth d2 of the second layer deep lines is larger than the depth s2 of the second layer shallow lines. In FIG. 2D, the first layer deep line 112D extends along the X-direction and is embedded in the interlayer dielectric 210. The second layer deep line 123D is electrically connected to the first layer deep line 112D through the via-connector 1V1.

In FIGS. 2A-2D, the depths of the first layer deep lines and the first layer shallow lines are adjusted based on design specification, and the depths of the second layer deep lines and the second layer shallow lines are also adjusted based on design specification. The difference between the depth d1 of the first layer deep lines and the depth s1 of the first layer shallow lines are related to the resistive value and the capacitive value differences between the first layer deep lines and the first layer shallow lines. The difference between the depth d2 of the second layer deep lines and the depth s2 of the second layer shallow lines are related to the resistive value and the capacitive value differences between the second layer deep lines and the second layer shallow lines. The depth difference between the depth d1 and the depth d2 and the depth difference between the depth s1 and the depth s2 are both related to other design considerations, as well. In some embodiments, the depth d1 differs from the depth d2. In some embodiments, the depth d1 is the same as the depth d2. In some embodiments, the depth s1 differs from the depth s2. In some embodiments, the depth s1 is the same as the depth s2.

Figure 3A:
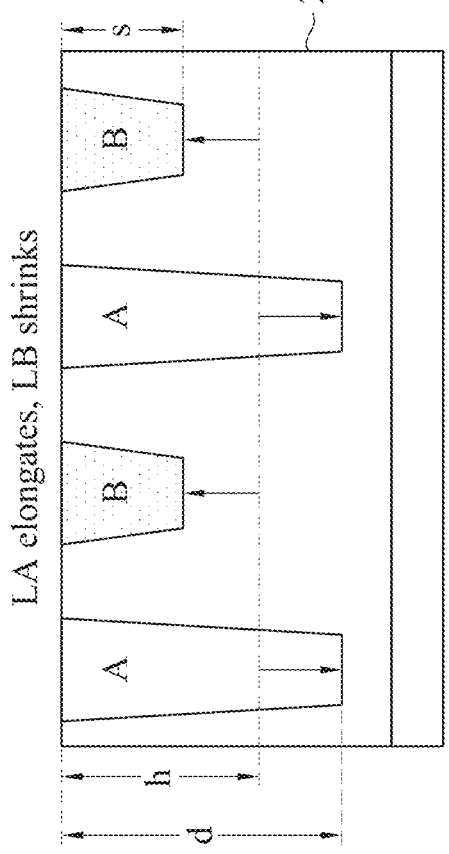
FIG. 3A is a cross-sectional view of deep lines and shallow lines with labeled depth dimensions, in accordance with some embodiments.
Figure 3B:
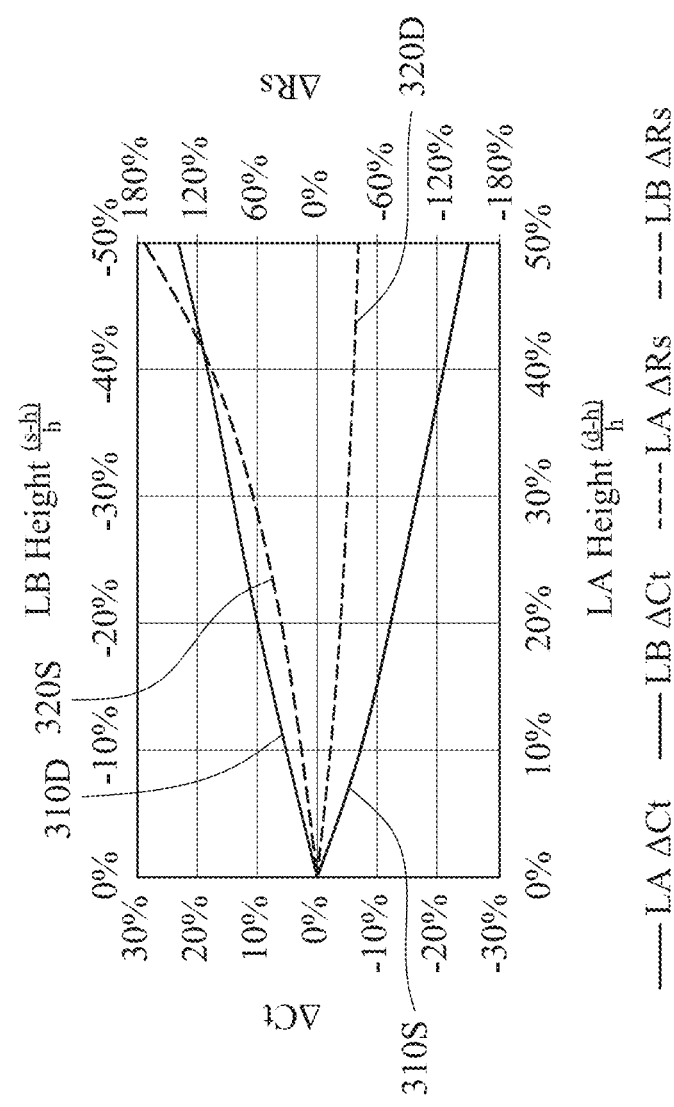
FIG. 3B is a diagram of a resistivity graph and capacitivity plotted against the changes in the depths of the conducting lines, in accordance with some embodiments.

FIG. 3A is a cross-sectional view of deep lines and shallow lines with labeled depth dimensions, in accordance with some embodiments. FIG. 3B is a diagram of a graph of the resistivity and the capacitivity plotted against the change in the depths of the conducting lines, in accordance with some embodiments. In the example of FIG. 3A, the deep lines labeled with letter "A" are modified from uniform lines by extending the deep lines into the interlayer dielectric 210 further than the uniform lines extend, and the shallow lines labeled with letter "B" are modified from uniform lines by extending the shallow lines into the interlayer dielectric 210 less than the uniform lines extend. The uniform lines appear in designs in which all conducting lines in the interlayer dielectric 210 have a same depth "h". In FIGS. 3A-3B, the depth "d" of the deep lines and the depth "s" of the shallow lines are compared with the depth "h" of the uniform lines.

In FIG. 3B, the curve 310D is a plot of the relative capacitance change $\Delta C t$ as a function of the relative height change $LA=(d-h)/h$ of the deep line, and the curve 320D is a plot of the relative resistance change $\Delta Rs$ as a function of the relative height change $LA=(d-h)/h$ of the deep line. As the depth of the deep line increases, the capacitance value in the curve 310D increases, and the resistance value in the curve 320D decreases. For example, when the depth of the deep line increases by 30%, the capacitance value in the curve 310D increases by 14%, and the resistance value in the curve 320D decreases by 30%. As the depth of the deep line increases, the changes in the capacitance value and the resistance value consequently cause a change in the RC constant of the deep line. In the example of FIG. 3B, when the depth of the deep line increases by 30%, the RC constant of a deep line per unit length decreases by 20%.

In FIG. 3B, the curve 310S is a plot of the relative capacitance change ΔCt as a function of the relative height change LB=(s−h)/h of the shallow line, and the curve 320S is a plot of the relative resistance change ΔRs as a function of the relative height change LB=(s−h)/h of the shallow line. As the depth of the shallow line decreases, the capacitance value in the curve 310S decreases, and the resistance value in the curve 320S increases. For example, when the depth of the shallow line decreases by 30%, the capacitance value in the curve 310S decreases by 16%, and the resistance value in the curve 320S increases by 65%. As the depth of the shallow line decreases, the changes in the capacitance value and the resistance value consequently cause a change in the RC constant of the shallow line. In the example of FIG. 3B, when the depth of the shallow line decreases by 30%, the RC constant of a shallow line per unit length increases by 39%.

In the example of FIG. 3B, the RC constant of a deep line is smaller than the RC constant of a shallow line, in some embodiments, deep lines are selected for forming signal conducting paths which require reduced time delays due to the RC constant of the conducting lines. In the embodiments of FIG. 1, the conducting path 101 between the first active device D1 and the second active device D2 is formed by the first layer deep line 112D, the second layer deep line 123D, the first layer deep line 115D, the second layer deep line 128D, and the first layer deep line 118D. The conducting path 101 is expected to have a smaller RC constant, as compared with the RC constant of an alternative path formed by a combination of the first layer shallow lines and/or the second layer shallow lines for connecting the first active device D1 with the second active device D2. On the other hand, an alternative conducting path formed by a combination of the first layer shallow lines and/or the second layer shallow lines is expected to have smaller stray capacitances.

Because the properties of a conducting path formed by deep lines are different from the properties of a conducting path formed by shallow lines, the selection of deep lines and shallow lines for various conducting paths in an integrated circuit would allow some performance improvements for the integrated circuit. In some embodiments, conducting paths of interests in an integrated circuit are ranked based on delay time of each conducting path, and the conducting paths having a delay time longer than a critical delay time are selected to form a list of selected paths for speed improvements. In some embodiments, the critical delay time is the delay time corresponding to the slack time that is zero. Here, the slack time is the time that a task can be delayed without causing another task to be delayed, or without impacting the completion of the overall task of a circuit system. In some embodiments, a selected path from the list for speed improvements is formed based on deep lines (e.g., the conducting path 101 in FIG. 1). In some embodiments, the auto placement and routing (APR) program is configured to find first layer deep lines and second layer deep lines to form the selected path for speed improvements. In some embodiments, the APR program is also configured to find first layer shallow lines and the second layer shallow lines to form one or more conducting paths which are the subjects of stray capacitance reduction.

In FIGS. 2A-2D, the first layer deep lines 111D-112D and the first layer shallow lines 111S-112S are in a first conductive layer above an insulation layer 205, and the second layer deep line 123D and the second layer shallow lines 122S and 123S are in a second conductive layer above the first conductive layer. In some embodiments, the insulation layer 205 is a top insulation layer fabricated in the front-end-of-line (FEOL) process, and the first conductive layer (having the first layer deep lines and the first layer shallow lines) is a first metal layer M0 that is immediately above the fabricated transistors in the integrated circuit, while the second conductive layer (having the second layer deep lines and the second layer shallow lines) is a second metal layer M1 that is immediately above the first metal layer M0.

In some alternative embodiments, the insulation layer 205 is the layer of interlayer dielectric that covers the first metal layer M0, and the first conductive layer (having the first layer deep lines and the first layer shallow lines) is a second metal layer M1 that is immediately above the first metal layer M0, while the second conductive layer (having the second layer deep lines and the second layer shallow lines) is a third metal layer M2 that is immediately above second metal layer M1. In still some alternative embodiments, the first conductive layer and the second conductive layer in FIGS. 2A-2D are correspondingly a fourth metal layer M3 and a third metal layer M2. In still some alternative embodiments, the first conductive layer in FIGS. 2A-2D is a metal layer above the fourth metal layer M3, while the second conductive layer in FIGS. 2A-2D is a metal layer above the third metal layer M2. Furthermore, unlike the embodiments of FIGS. 2A-2D in which the second conductive layer is above the first conductive layer, in some alternative embodiments, the second conductive layer is below the first conductive layer.

In FIGS. 2A-2D, two conductive layers that have both deep lines and shallow lines are depicted. In some embodiments, however, the integrated circuit 100 in FIG. 1 also include additional conductive layers. Some of the additional conductive layers also have both deep lines and shallow lines, while some of the additional conductive layers of the integrated circuit 100 include only uniform lines. For example, in the embodiments as shown in FIG. 4A-4C, there are three conductive layers that have both deep lines and shallow lines.

FIGS. 4A-4C are cross-sectional views of the integrated circuit in FIG. 1, in accordance with some embodiments. The cross-sectional views in FIGS. 4A-4C are correspondingly in the same cutting planes as the cross-sectional views in FIGS. 2A-2C. The cross-sectional views in FIGS. 4A-4C and FIGS. 2A-2C have the same first conductive layer and the same second conductive layer. In FIGS. 4A-4C and FIGS. 2A-2C, the first conductive layer has the first layer deep lines 111D-112D and the first layer shallow lines 111S-112S embedded in the interlayer dielectric 210, and the second conductive layer has the second layer deep line 123D and the second layer shallow line 122S embedded in the interlayer dielectric 220. In FIGS. 4A-4C, the third conductive layers is also depicted. The third conductive layer has the third layer deep lines 431D-432D and the third layer shallow lines 431S-432S embedded in the interlayer dielectric 430.

In some alternative embodiments, the stacked positions of the first conductive layer, the second conductive layer, and the third conductive layer are different from the stacked positions as depicted in FIG. 4A-4C. For example, in some alternative embodiments, the third conductive layer is between the first conductive layer and the second conductive layer. In some alternative embodiments, the third conductive layer is below both the first conductive layer and the second conductive layer. In contrast, the third conductive layer in FIG. 4A-4C is above both the first conductive layer and the second conductive layer. Additionally, while the third conductive layer in FIG. 4A-4C is formed with both deep lines and shallow lines, the third conductive layer in some alternative embodiments is formed with only uniform lines. In some alternative embodiments, the third conductive layer with only uniform lines is below both the first conductive layer and the second conductive layer. In some alternative embodiments, the third conductive layer with only uniform lines is between the first conductive layer and the second conductive layer.

In some embodiments, in addition to the three conductive layers depicted in FIG. 4A-4C, the integrated circuit 100 in FIG. 1 also includes more conductive layers which are either formed with uniform lines or formed with both deep lines and shallow lines. In some alternative embodiments, at least two conductive layers are deposited between the first conductive layer and the second conductive layer. Each of the at least two conductive layers are either formed with uniform lines or formed with both deep lines and shallow lines. In some alternative embodiments, at least two conductive layers are deposited above the first conductive layer and the second conductive layer. In some alternative embodiments, at least two conductive layers are deposited below the first conductive layer and the second conductive layer.

In some embodiments, a signal conducting path is formed with a combination of the deep lines in the first conductive layer, in the second conductive layer, and/or in other conductive layers, to reduce the RC constant of the signal conducting path. In some embodiments, a signal conducting path is formed with a combination of the shallow lines in the first conductive layer, in the second conductive layer, and/or in other conductive layers, to reduce the stray capacitances at various segments of the signal conducting path. In some embodiments, a signal conducting path connecting the output of a first active device with the input of a second active device is formed with a combination of the deep lines and the shallow lines in the various conductive layers, to reduce the total time delay of the signal propagation from the first active device to the second active device along the signal conducting path.

Figure 5:
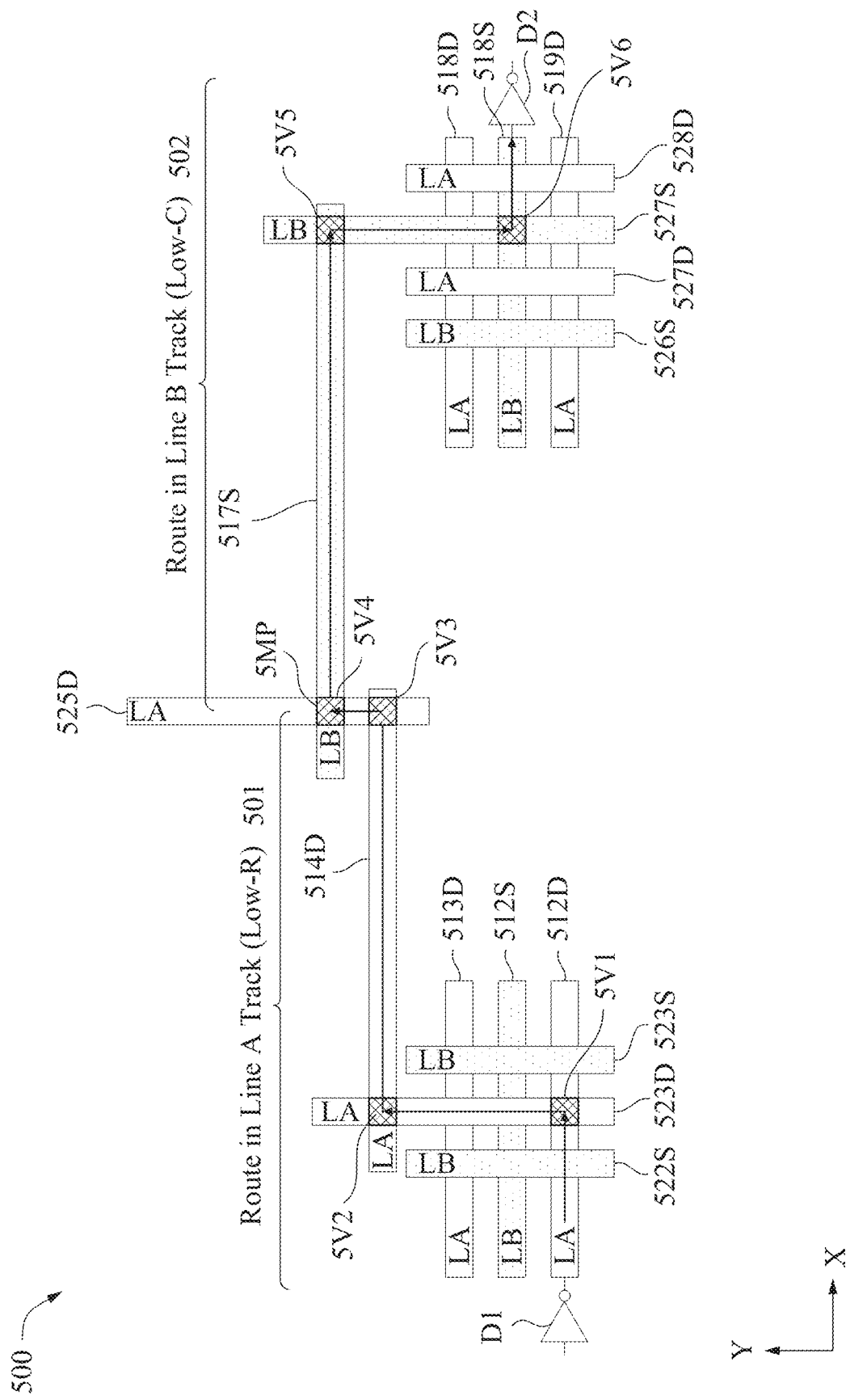
FIG. 5 is a layout diagram of an integrated circuit having a signal conducting path formed with a combination of deep lines and shallow lines, in accordance with some embodiments.

FIG. 5 is a layout diagram of an integrated circuit 500 having a signal conducting path formed with a combination of deep lines and shallow lines, in accordance with some embodiments. The integrated circuit 500 includes first layer deep lines and first layer shallow lines extending in the X-direction. The integrated circuit 500 also includes second layer deep lines and second layer shallow lines extending in the Y-direction. The first layer deep lines (512D, 513D, 514D, 518D, and 519D) and the first layer shallow lines (512S, 517S, and 518S) are in a first conductive layer. The second layer deep lines (523D, 525D, 527D, and 528D) and the second layer shallow lines (522S, 523S, 526S, and 527S) are in a second conductive layer.

The integrated circuit 500 includes a first active device D1 and a second active device D2. The output of the first active device D1 is electrically connected to the input of the second active device D2 through a conducting path that includes a low resistivity portion 501 and a low capacitivity portion 502. The low resistivity portion 501 of the conducting path includes the first layer deep lines 512D and 514D and the second layer deep lines 523D and 525D. The low capacitivity portion 502 of the conducting path includes the first layer shallow lines 517S and 518S and the second layer shallow line 527S. In the low resistivity portion 501, the first layer deep line 512D is electrically connected to the second layer deep line 523D through the via-connector 5V1, the second layer deep line 523D is electrically connected to the first layer deep line 514D through the via-connector 5V2, and the first layer deep lines 514D is electrically connected to the second layer deep line 525D through the via-connector 5V3. In the low capacitivity portion 502, the first layer shallow line 517S is electrically connected to the second layer shallow line 527S through the via-connector 5V5, and the second layer shallow line 527S is electrically connected to the first layer shallow line 518S through the via-connector 5V6.

When the second layer deep line 525D is electrically connected to the first layer shallow line 517S through the via-connector 5V4, the low resistivity portion 501 of the conducting path is electrically connected to the low capacitivity portion 502 of the conducting path. The mutation point 5MP is at the via-connector 5V4 between the low resistivity portion 501 of the conducting path and the low capacitivity portion 502 of the conducting path. The low resistivity portion 501 is electrically connected between the output of the first active device D1 and the mutation point 5MP, and the low capacitivity portion 502 is electrically connected between the mutation point 5MP and the input of the second active device D2.

The low resistivity portion 501 having the deep lines and the low capacitivity portion 502 having the shallow lines are selected to increase the speed of the signals transmitted from the first active device D1 to the second active device D2, as compared with the speed of the signals in some alternative designs in which the signal path from the first active device D1 to the second active device D2 is formed with uniform lines (which have the depth smaller than the depth of the deep lines but larger than the depth of the shallow lines).

In some embodiments, such as in the embodiments as shown in FIGS. 6A-6F, different configurations of the low resistivity portion, the low capacitivity portion, and the mutation point are compared to find an optimized configuration. In some embodiments, the optimized configuration is selected to reduce the total time delay of the signal propagation from the first active device to the second active device along the signal conducting path. In addition to the total time delay, in some embodiments, the selection of the optimized configuration also includes the balance of other factors, such as electromigration due to the IR-drop and cross couplings due to the stray capacitance.

FIGS. 6A-6F are layout diagrams of integrated circuits having signal conducting paths formed with different configurations of the low resistivity portion, the low capacitivity portion, and the mutation point, in accordance with some embodiments. In each of the layout diagrams in FIGS. 6A-6F, a different position on a signal conducting path is selected as the position for the mutation point. Based on the layout diagrams in FIGS. 6A-6F, different configurations of the signal conducting path are compared, with respect to the reduction of the signal propagation time from the first active device D1 to the second active device D2.

Figure 6A:
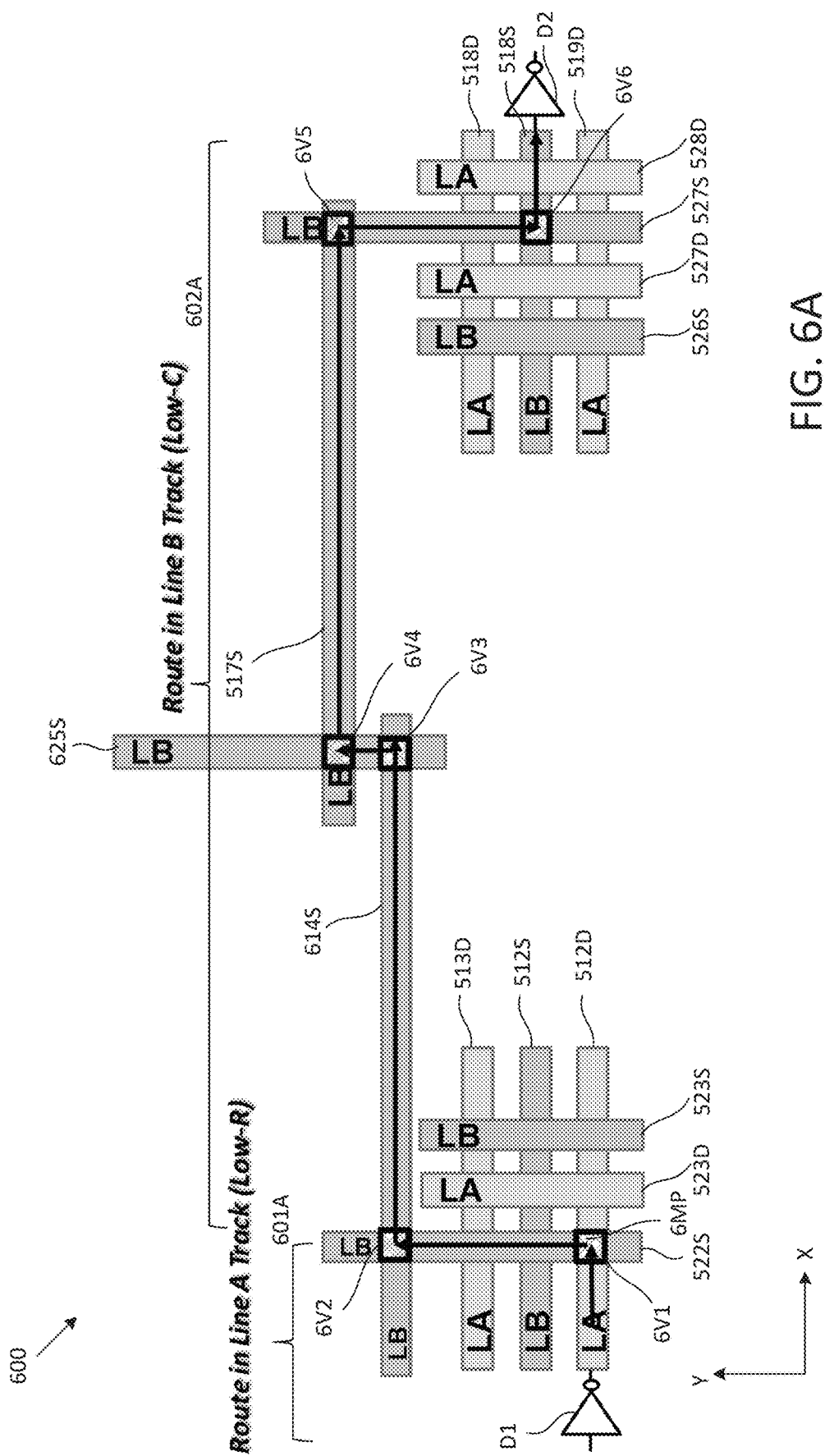
FIGS. 6A-6F are layout diagrams of integrated circuits having signal conducting paths formed with different configurations of the low resistivity portion, the low capacitivity portion, and the mutation point, in accordance with some embodiments.

In a first configuration as shown in FIG. 6A, the conducting path from the first active device D1 to the second active device D2 includes a low resistivity portion 601A and a low capacitivity portion 602A. The low resistivity portion 601A includes the first layer deep line 512D. The low capacitivity portion 602A includes the second layer shallow line 522S, the first layer shallow lines 614S, the second layer shallow line 625S, the first layer shallow line 517S, the second layer shallow line 527S, and the first layer shallow line 518S (which are correspondingly connected together through the via-connectors 6V2, 6V3, 6V4, 6V5, and 6V6). The mutation point 6MP is at the via-connector 6V1 that electrically connects the first layer deep line 512D with the second layer shallow line 522S. The low resistivity portion 601A is between the output of the first active device D1 and the mutation point 6MP. The low capacitivity portion 602A is between the mutation point 6MP and the input of the second active device D2.

Figure 6B:
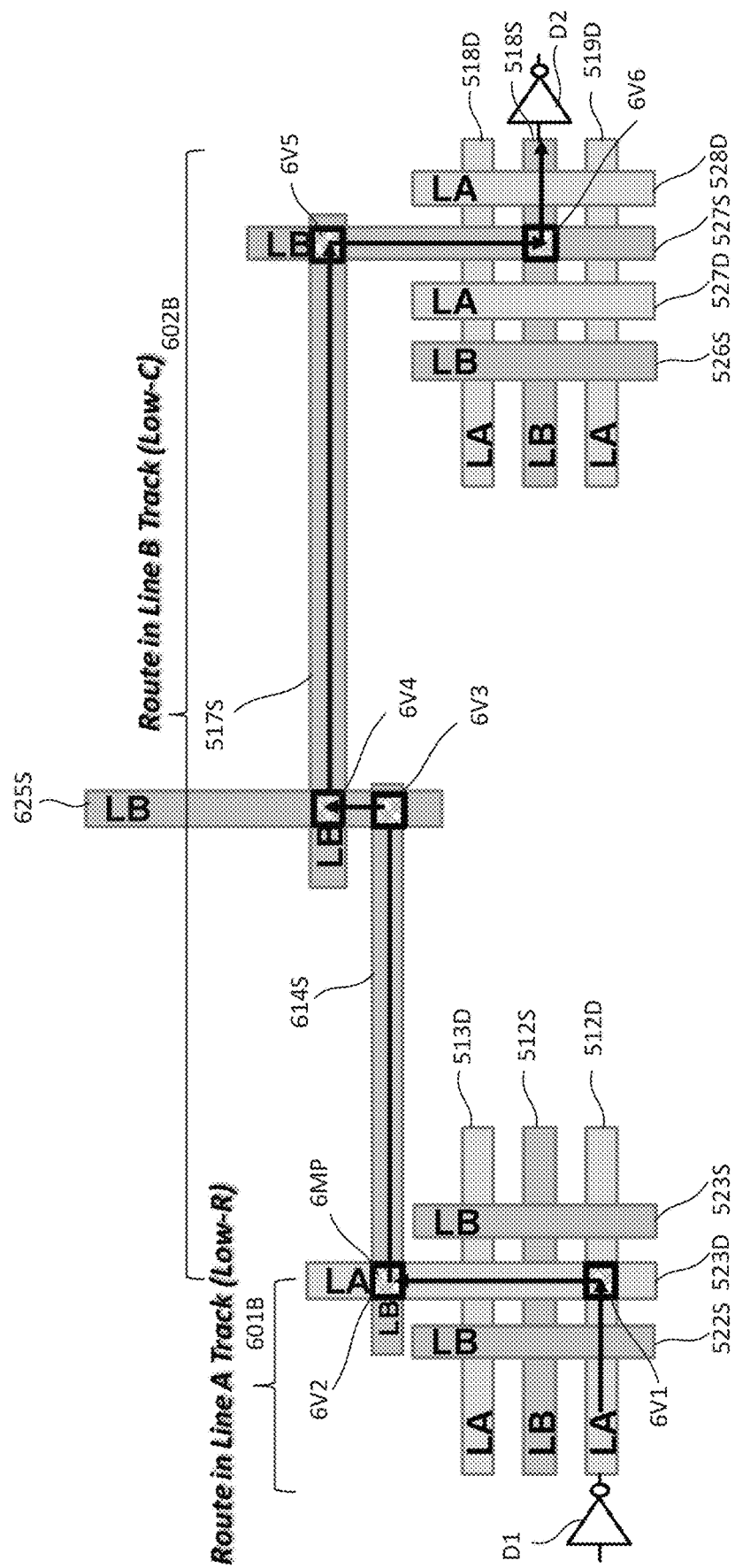

In a second configuration as shown in FIG. 6B, the conducting path from the first active device D1 to the second active device D2 includes a low resistivity portion 601B and a low capacitivity portion 602B. The low resistivity portion 601B includes the first layer deep line 512D and the second layer deep line 523D connected together through the via-connector 6V1. The low capacitivity portion 602B includes the first layer shallow lines 614S, the second layer shallow line 625S, the first layer shallow line 517S, the second layer shallow line 527S, and the first layer shallow line 518S (which are correspondingly connected together through the via-connectors 6V3, 6V4, 6V5, and 6V6). The mutation point 6MP is at the via-connector 6V2 that electrically connects the second layer deep line 523D with the first layer shallow lines 614S. The low resistivity portion 601B is between the output of the first active device D1 and the mutation point 6MP. The low capacitivity portion 602B is between the mutation point 6MP and the input of the second active device D2.

Figure 6C:
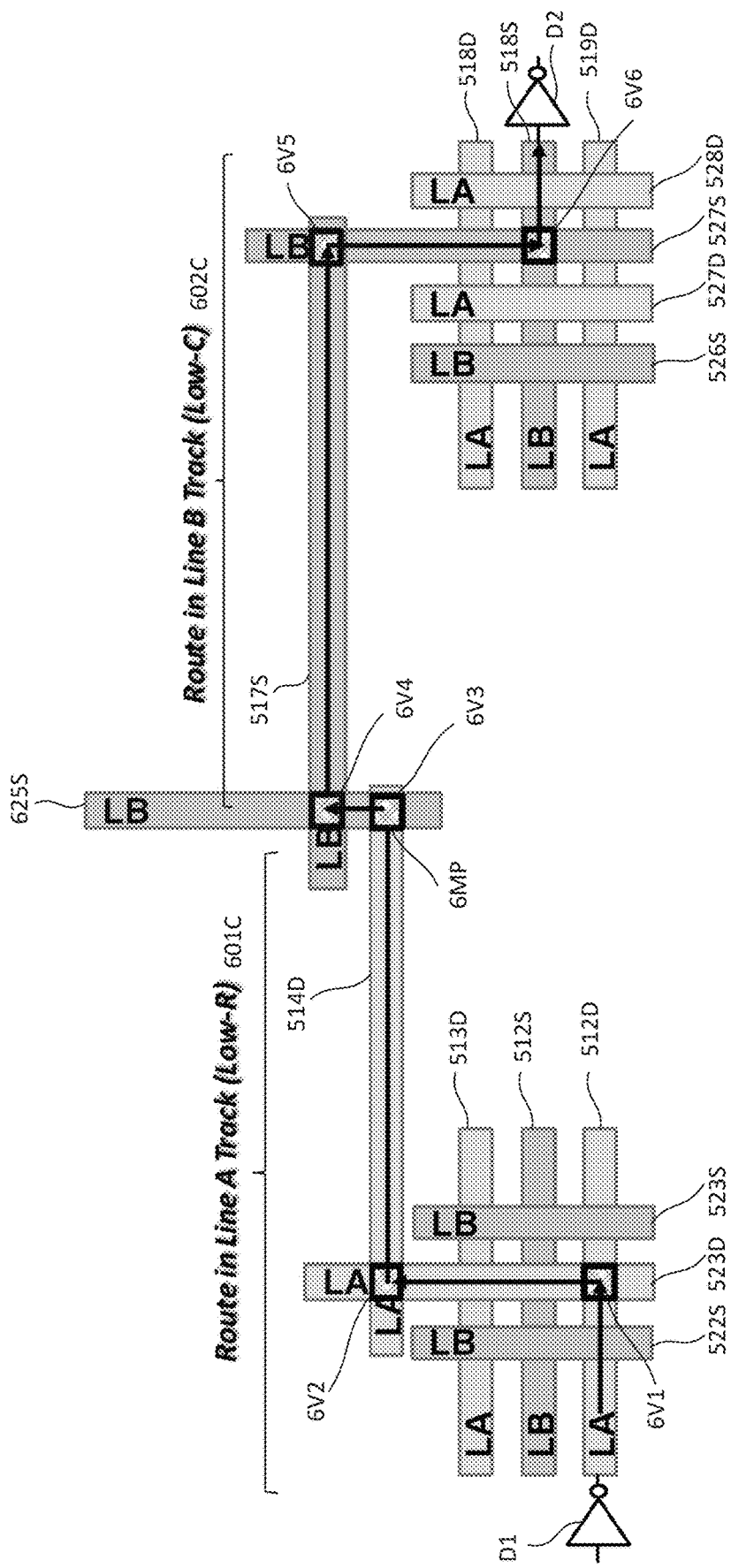

In a third configuration as shown in FIG. 6C, the conducting path from the first active device D1 to the second active device D2 includes a low resistivity portion 601C and a low capacitivity portion 602C. The low resistivity portion 601C includes the first layer deep line 512D, the second layer deep line 523D, and the first layer deep line 514D (which are correspondingly connected together through the via-connectors 6V1 and 6V2). The low capacitivity portion 602C includes the second layer shallow line 625S, the first layer shallow line 517S, the second layer shallow line 527S, and the first layer shallow line 518S (which are correspondingly connected together through the via-connectors 6V4, 6V5, and 6V6). The mutation point 6MP is at the via-connector 6V3 that electrically connects the first layer deep line 514D with the second layer shallow line 625S. The low resistivity portion 601C is between the output of the first active device D1 and the mutation point 6MP. The low capacitivity portion 602C is between the mutation point 6MP and the input of the second active device D2.

Figure 6D:
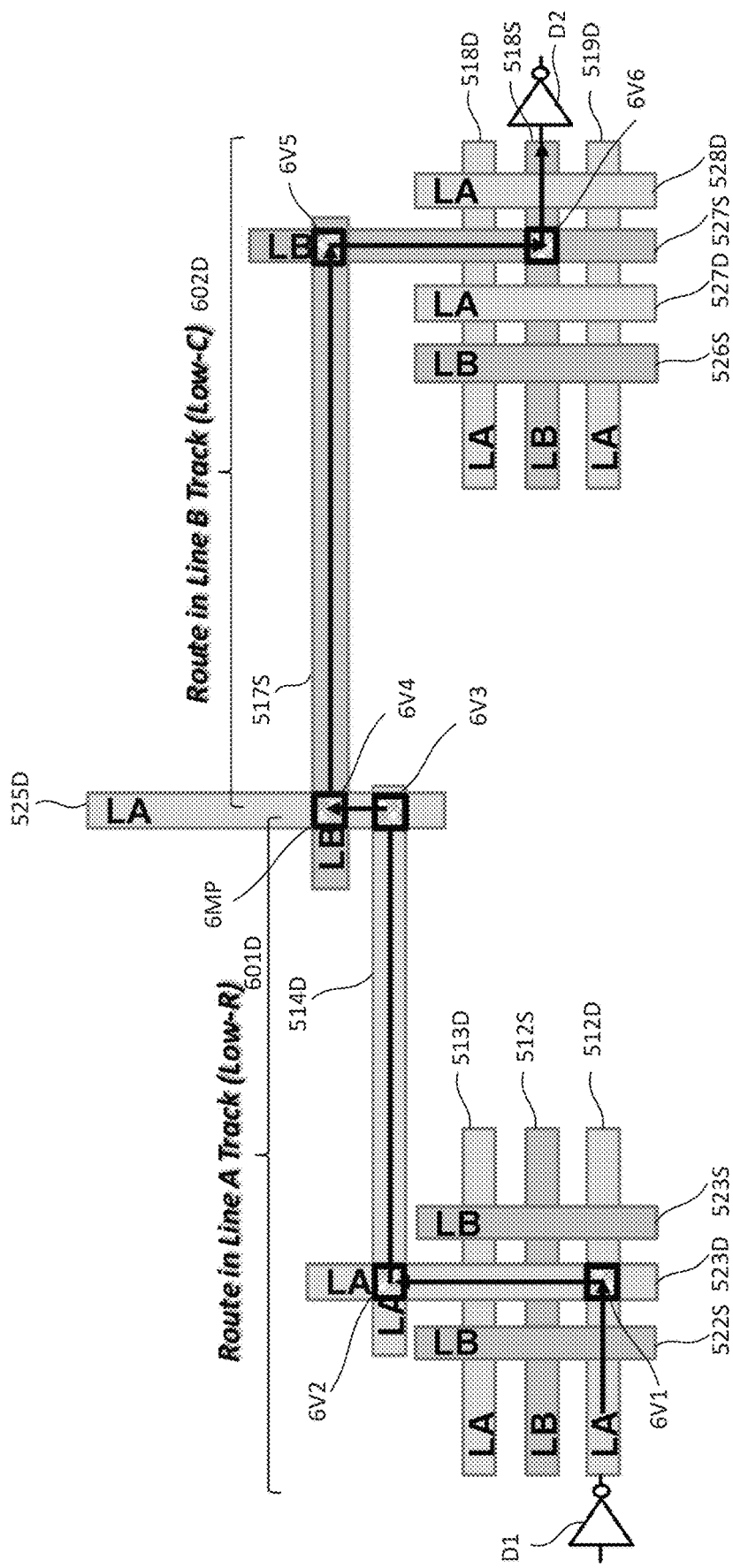

In a fourth configuration as shown in FIG. 6D, the conducting path from the first active device D1 to the second active device D2 includes a low resistivity portion 601D and a low capacitivity portion 602D. The low resistivity portion 601D includes the first layer deep line 512D, the second layer deep line 523D, the first layer deep line 514D, and the second layer deep line 525D (which are correspondingly connected together through the via-connectors 6V1, 6V2, and 6V3). The low capacitivity portion 602D includes the first layer shallow line 517S, the second layer shallow line 527S, and the first layer shallow line 518S (which are correspondingly connected together through the via-connectors 6V5 and 6V6). The mutation point 6MP is at the via-connector 6V4 that electrically connects the second layer deep line 525D with the first layer shallow line 517S. The low resistivity portion 601D is between the output of the first active device D1 and the mutation point 6MP. The low capacitivity portion 602D is between the mutation point 6MP and the input of the second active device D2.

Figure 6E:
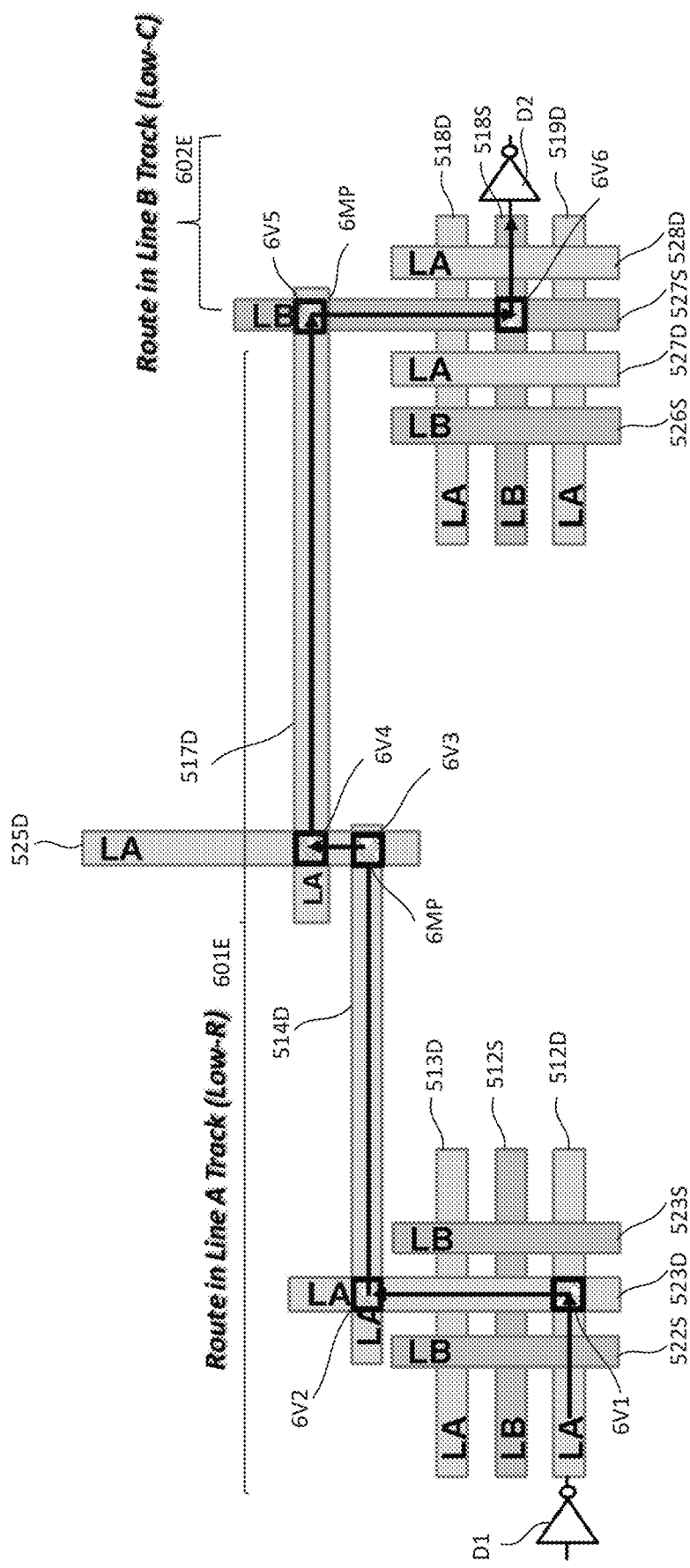

In a fifth configuration as shown in FIG. 6E, the conducting path from the first active device D1 to the second active device D2 includes a low resistivity portion 601E and a low capacitivity portion 602E. The low resistivity portion 601E includes the first layer deep line 512D, the second layer deep line 523D, the first layer deep line 514D, the second layer deep line 525D, and the first layer deep line 517D (which are correspondingly connected together through the via-connectors 6V1, 6V2, 6V3, and 6V4). The low capacitivity portion 602E includes the second layer shallow line 527S and the first layer shallow line 518S electrically connected together through the via-connector 6V6. The mutation point 6MP is at the via-connector 6V5 that electrically connects the first layer deep line 517D with the second layer shallow line 527S. The low resistivity portion 601E is between the output of the first active device D1 and the mutation point 6MP. The low capacitivity portion 602E is between the mutation point 6MP and the input of the second active device D2.

Figure 6F:
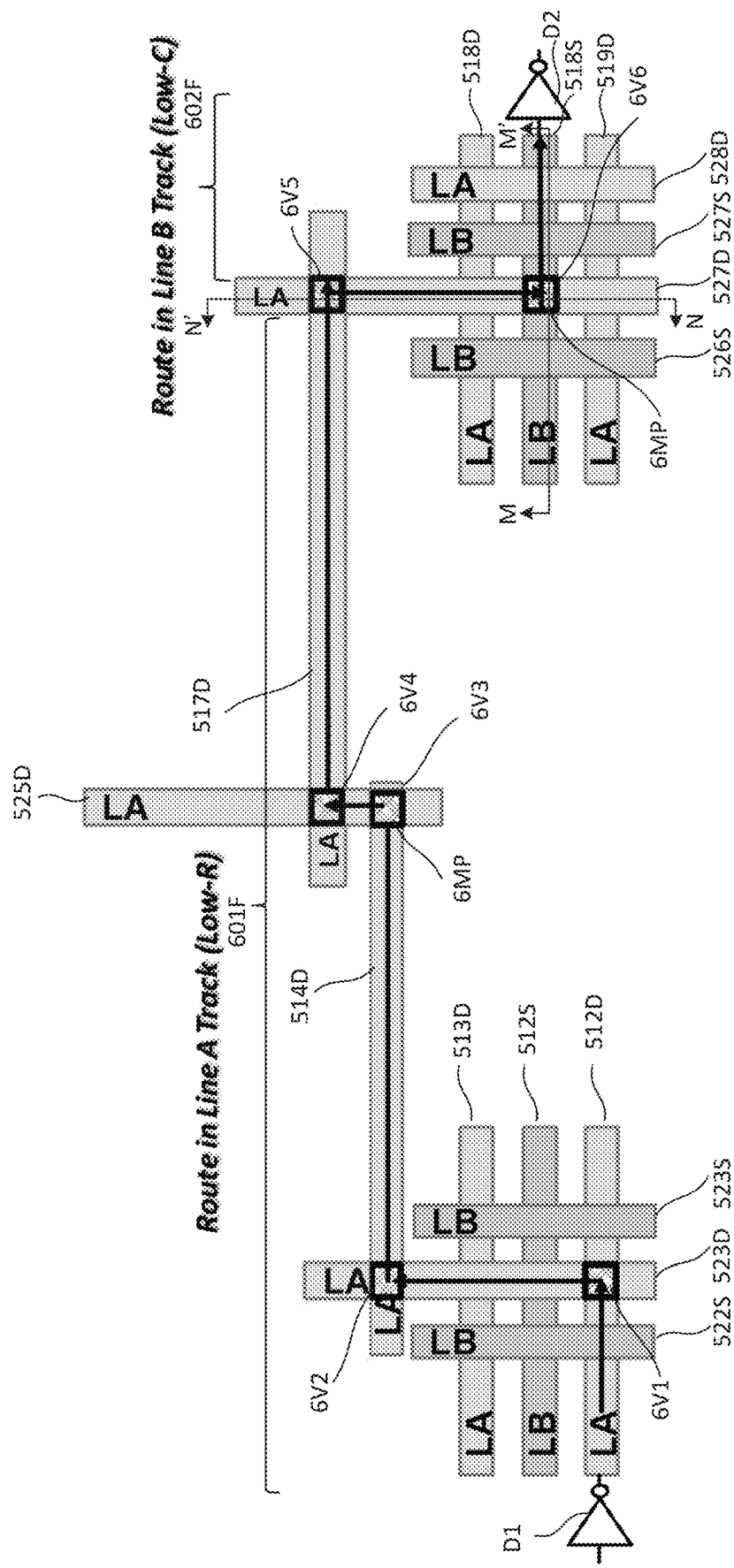

In a sixth configuration as shown in FIG. 6F, the conducting path from the first active device D1 to the second active device D2 includes a low resistivity portion 601F and a low capacitivity portion 602F. The low resistivity portion 601F includes the first layer deep line 512D, the second layer deep line 523D, the first layer deep line 514D, the second layer deep line 525D, the first layer deep line 517D, and the second layer deep line 527D (which are correspondingly connected together through the via-connectors 6V1, 6V2, 6V3, and 6V4, and 6V5). The low capacitivity portion 602F includes the first layer shallow line 518S. The mutation point 6MP is at the via-connector 6V6 that electrically connects the second layer deep line 527D with the first layer shallow line 518S. The low resistivity portion 601F is between the output of the first active device D1 and the mutation point 6MP. The low capacitivity portion 602F is between the mutation point 6MP and the input of the second active device D2.

In some embodiments, the auto placement and routing (APR) program compares the total time delay of the signal propagation from the first active device D1 to the second active device D2 in each of the configurations in FIGS. 6A-6F, and the APR program then selects one of the configurations in FIGS. 6A-6F which has the smallest total time delay of the signal propagation. The mutation point 6MP selected by the APR program is at one of the via-connectors (such as 6V1, 6V2, 6V3, 6V4, 6V5, or 6V6).

In some embodiments, multiple signal conducting paths share a common portion of the signal conducting paths. The selection of the mutation point for each signal conducting path involves the comparison of the total time delay of the signal propagation in each signal conducting path with different configurations.

Figure 7:
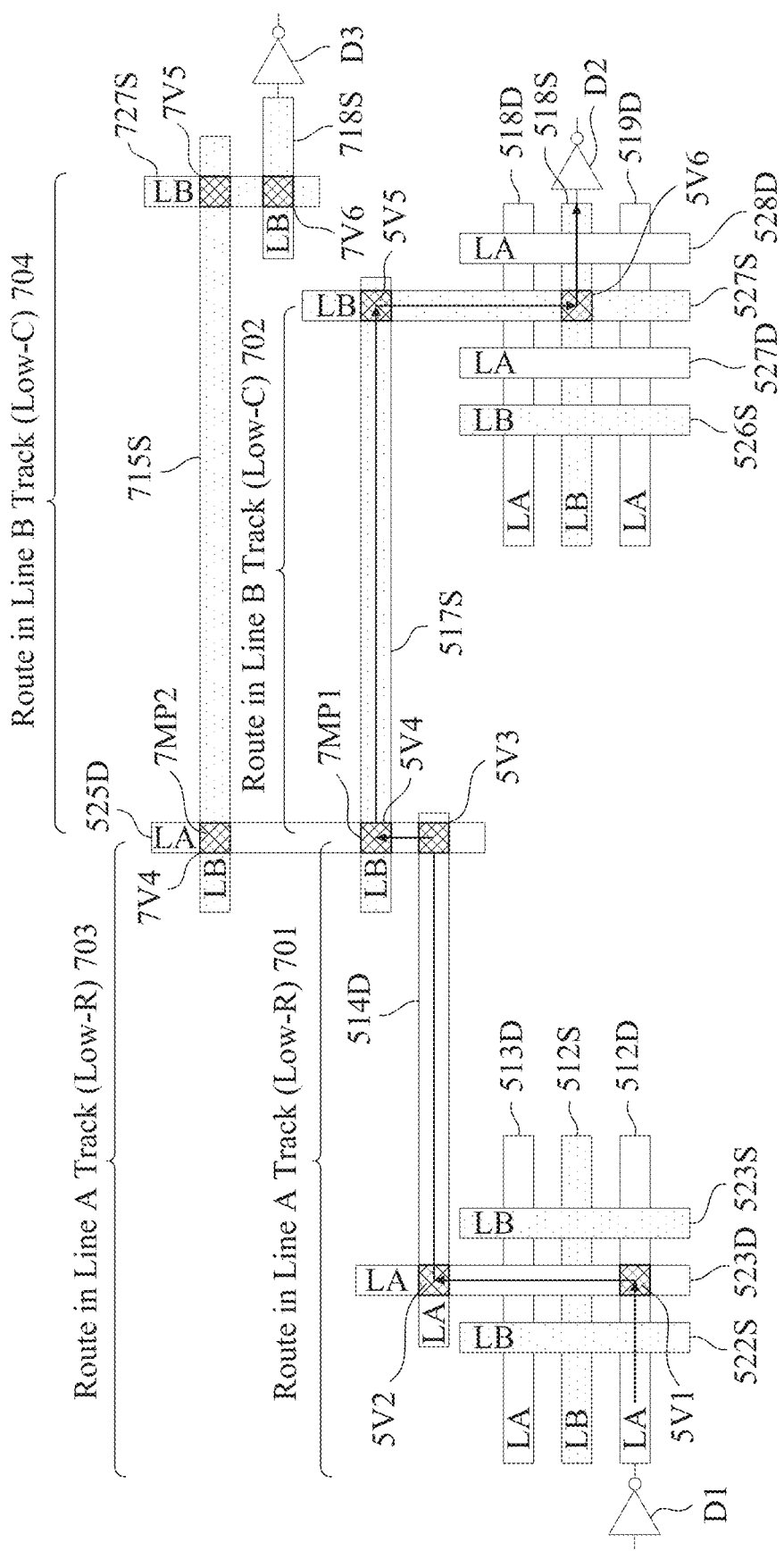
FIG. 7 is a layout diagram of an integrated circuit having multiple signal conducting paths formed with combinations of deep lines and shallow lines, in accordance with some embodiments.

FIG. 7 is a layout diagram of an integrated circuit 700 having multiple signal conducting paths formed with combinations of deep lines and shallow lines, in accordance with some embodiments. In FIG. 7, the output of the first active device D1 is electrically connected to the input of the second active device D2 through a first conducting path that includes a low resistivity portion 701 and a low capacitivity portion 702, and the output of the first active device D1 is electrically connected to the input of the third active device D3 through a second conducting path that includes a low resistivity portion 703 and a low capacitivity portion 704.

In FIG. 7, the low resistivity portion 701 of the first conducting path in FIG. 7 is the same as the low resistivity portion 501 in FIG. 5. The low capacitivity portion 702 of the first conducting path in FIG. 7 is the same as the low capacitivity portion 502 in FIG. 5. The first mutation point 7MP1 for the first conducting path in FIG. 7 is at the via-connector 5V4. The low resistivity portion 701 is electrically connected between the output of the first active device D1 and first mutation point 7MP1, and the low capacitivity portion 702 is electrically connected between the first mutation point 7MP1 and the input of the second active device D2.

In FIG. 7, the low resistivity portion 703 of the second conducting path includes the first layer deep line 512D, the second layer deep line 523D, the first layer deep line 514D, and the second layer deep line 525D (which are correspondingly connected together through the via-connectors 5V1, 5V2, and 5V3). The low capacitivity portion 704 of the second conducting path includes the first layer shallow line 715S, the second layer shallow line 727S, and the first layer shallow line 718S (which are correspondingly connected together through the via-connectors 7V5 and 7V6). The second mutation point 7MP2 for the second conducting path in FIG. 7 is at the via-connector 7V4 that electrically connects the second layer deep line 525D with the first layer shallow line 715S. The low resistivity portion 703 is electrically connected between the output of the first active device D1 and second mutation point 7MP2, and the low capacitivity portion 704 is electrically connected between the second mutation point 7MP2 and the input of the third active device D3.

In FIG. 7, when the first conducting path is from the first active device D1 to the second active device D2 and the second conducting path is from the first active device D1 to the third active device D3, the first conducting path and the second conducting path share a common conducting path which is from the output of the first active device D1 to the second layer deep line 525D. Here, the second layer deep line 525D is a fan-out node which branches the common conducting path into the first conducting path and the second conducting path. The low capacitivity portion 702 of the first conducting path forms at least a portion of a first branched conducting path between the fan-out node and the input of the second active device D2. The low capacitivity portion 704 of the second conducting path forms at least a portion of a second branched conducting path between the fan-out node and the input of the third active device D3. Each of first branched conducting path and the second branched conducting path is a conducting path that excludes first layer deep lines and second layer deep lines. In some embodiments, each branched conducting path not only excludes deep lines in the first conducting layer and in the second conducting layer, but also excludes deep lines in other conducting layers. In some embodiments, while each branched conducting path excludes deep lines in the first conducting layer and in the second conducting layer, each branched conducting path nevertheless includes deep lines in one or more other conducting layers.

In each of the conducting path from the first active device D1 to the second active device D2 in FIG. 1, FIG. 5, and FIGS. 6A-6F, a mutation point is between a low resistivity portion of the conducting path and a low capacitivity portion of the conducting path. In some embodiments, the mutation point is at a via-connector. In some embodiments, such as in each of the conducting paths in FIGS. 8A-8B, the mutation point is a fan-out node that joins at least two branched conducting paths, and each of the at least two branched conducting paths includes a low capacitivity portion of the conducting path.

Figure 8A:
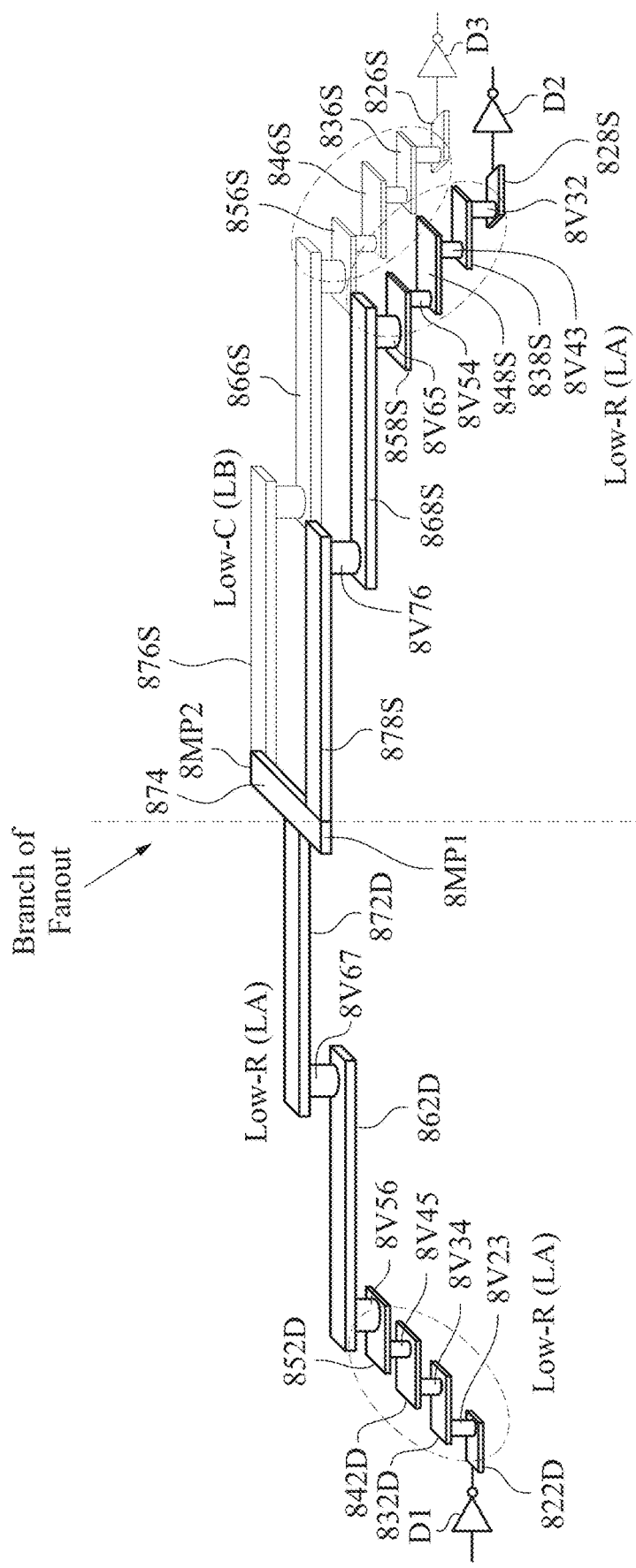
FIGS. 8A-8B are schematic diagrams of integrated circuits having multiple signal conducting paths formed with combinations of deep lines and shallow lines, in accordance with some embodiments.
Figure 8B:
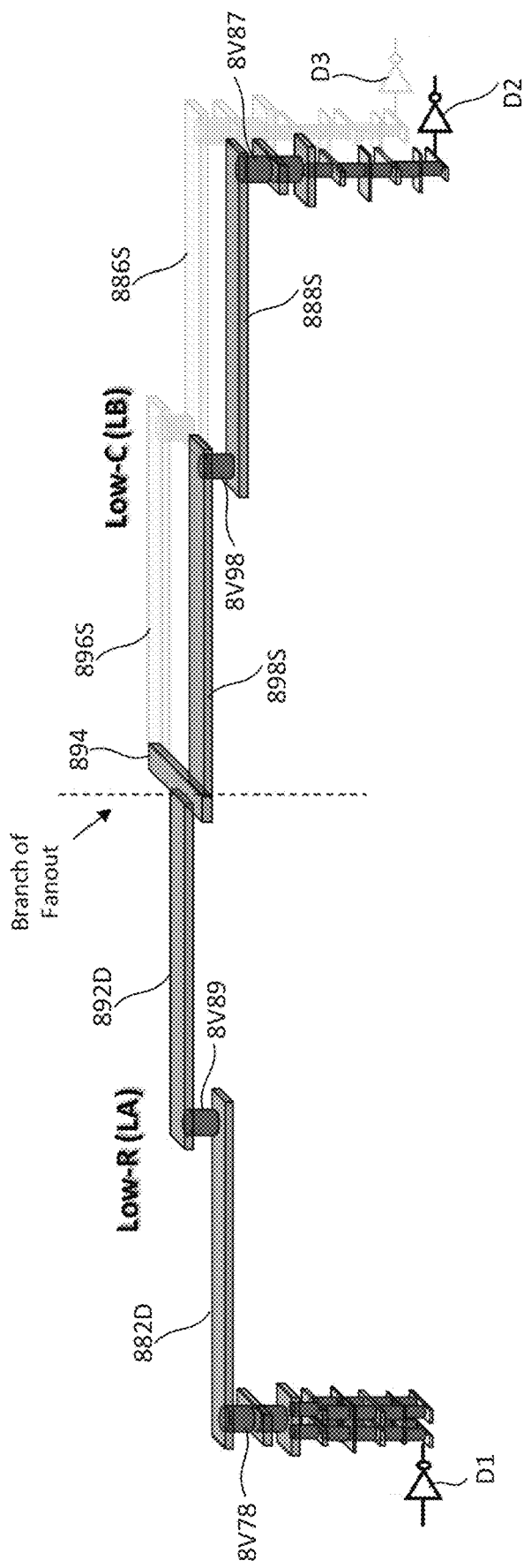

FIGS. 8A-8B are schematic diagrams of integrated circuits having multiple signal conducting paths formed with combinations of deep lines and shallow lines, in accordance with some embodiments. In FIG. 8A, a first conducting path from the first active device D1 to the second active device D2 includes a low resistivity portion and a low capacitivity portion. The low resistivity portion of the first conducting path includes a first layer deep line 862D and a second layer deep line 872D electrically connected together through a via-connector 8V67. The low capacitivity portion of the first conducting path includes a first layer shallow line 868S and a second layer shallow line 878S electrically connected together through a via-connector 8V76. The first layer deep line 862D and the first layer shallow line 868S are in a first conductive layer. The second layer deep line 872D and the second layer shallow line 878S are in a second conductive layer. In some embodiments, the integrated circuits incudes at least eight metal layers (from M0 to M7) above the top insulation layer fabricated in the front-end-of-line (FEOL) process. The first conductive layer is the seventh metal layer M6 (which is above the other six metal layers M0-M5), and the second conductive layer is the eighth metal layer M7 (which is above the other seven metal layers M0-M6).

In FIG. 8A, the low resistivity portion of the first conducting path is electrically connected with the low capacitivity portion of the first conducting path through the second layer conducting line 874. In some embodiments, the second layer conducting line 874 is a second layer deep line. In some embodiments, the second layer conducting line 874 is a second layer shallow line. In some embodiments, the second layer conducting line 874 is a second layer uniform line (which has a depth that is larger than the depth of a second layer shallow line but smaller than the depth of a second layer deep line). In FIG. 8A, the second layer conducting line 874 is a fan-out node. The first conducting path includes a first mutation point 8MP1 at the fan-out node between the low resistivity portion and the low capacitivity portion. The second conducting path from the first active device D1 to the third active device D3 branches out from the first conducting path (which is from the first active device D1 to the second active device D2) at the fan-out node (i.e., the second layer conducting line 874). The second conducting path includes a low resistivity portion and a low capacitivity portion. The low resistivity portion is between the first active device D1 and a second mutation point 8MP2 at the fan-out node. The low capacitivity portion is between the second mutation point 8MP2 and the input of the third active device D3. The low resistivity portion of the second conducting path includes the first layer deep line 862D and the second layer deep line 872D. The low capacitivity portion of the second conducting path includes a first layer shallow line 866S and a second layer shallow line 876S electrically connected together through a corresponding via-connector.

In some embodiments, in addition to the first layer deep line 862D in the seventh metal layer M6 and the second layer deep line 872D in the eighth metal layer M7, the low resistivity portion of the first conducting path also includes conducting lines 822D, 832D, 842D, and 852D electrically connected together through the corresponding via-connectors 8V23, 8V34, and 8V45. The conducting line 852D is electrically connected to the first layer deep line 862D through the via-connector 8V56. The conducting line 822D is electrically connected to the output of the first active device D1. In some embodiments, the conducting line 822D is electrically connected to the output of the first active device D1 through some via-connectors and the conducting lines in the first metal layer M0 and in the second metal layer M1 (which are not shown in the figure). In some embodiments, the conducting line 822D is a deep line in the third metal layer M2, the conducting line 832D is a deep line in the fourth metal layer M3, the conducting line 842D is a deep line in the fifth metal layer M4, and the conducting line 852D is a deep line in the sixth metal layer M5. In some embodiments, one or more of the conducting lines 822D, 832D, 842D, and 852D are not deep lines. In some embodiments, one or more of the conducting lines 822D, 832D, 842D, and 852D are shallow lines or uniform lines.

In some embodiments, in addition to the first layer shallow line 868S in the seventh metal layer M6 and the second layer shallow line 878S in the eighth metal layer M7, the low capacitivity portion of the first conducting path connecting to the second active device D2 also includes conducting lines 828S, 838S, 848S, and 858S electrically connected together through the corresponding via-connectors 8V32, 8V43, and 8V54. The conducting line 858S is electrically connected to the first layer shallow line 868S through the via-connector 8V65. The conducting line 828S is electrically connected to the input of the second active device D2. In some embodiments, the conducting line 828S is electrically connected to the input of the second active device D2 through some via-connectors and some conducting lines in the first metal layer M0 and in the second metal layer M1 (which are not shown in the figure). In some embodiments, the conducting line 828S is a shallow line in the third metal layer M2, the conducting line 838S is a shallow line in the fourth metal layer M3, the conducting line 848S is a shallow line in the fifth metal layer M4, and the conducting line 858S is a shallow line in the sixth metal layer M5. In some embodiments, one or more of the conducting lines 828S, 838S, 848S, and 858S are not shallow lines. In some embodiments, one or more of the conducting lines 828S, 838S, 848S, and 858S are deep lines or uniform lines.

In some embodiments, in addition to the first layer shallow line 866S in the seventh metal layer M6 and the second layer shallow line 876S in the eighth metal layer M7, the low capacitivity portion of the second conducting path connecting to the third active device D3 also includes conducting lines 826S, 836S, 846S, and 856S electrically connected together through various via-connectors. The conducting line 856S is electrically connected to the first layer shallow line 866S through a corresponding via-connector. The conducting line 826S is electrically connected to the input of the third active device D3. In some embodiments, the conducting line 826S is electrically connected to the input of the third active device D3 through some via-connectors and some conducting lines in the first metal layer M0 and in the second metal layer M1. In some embodiments, the conducting line 826S is a shallow line in the third metal layer M2, the conducting line 836S is a shallow line in the fourth metal layer M3, the conducting line 846S is a shallow line in the fifth metal layer M4, and the conducting line 856S is a shallow line in the sixth metal layer M5. In some embodiments, one or more of the conducting lines 826S, 836S, 846S, and 856S are not shallow lines. In some embodiments, one or more of the conducting lines 826S, 836S, 846S, and 856S are deep lines or uniform lines.

When the first conducting path from the first active device D1 to the second active device D2 is implemented with a low resistivity portion and a low capacitivity portion, the time delay of the signal propagation along the first conducting path is reduced. In one specific example as shown in FIG. 8A, the time delay of the signal propagation in the first conducting path having the low resistivity portion and the low capacitivity portion is reduced by 5.4%, as compared with an alternative design in which all conducting lines in the first conducting path are implemented as uniform lines. The 5.4% reduction is a sum of the individual reductions 1.5%, 1.8%, 0.2%, 0.4%, 0.4%, and 1.1% correspondingly in metal layers M7, M6, M5, M4, M3, and M2.

In the specific example as shown in FIG. 8A, the second layer deep line 872D in the low resistivity portion and the second layer shallow line 878S in the low capacitivity portion are in the eighth metal layer M7. The reduction of the time delay due to the second layer deep line 872D and the second layer shallow line 878S is 1.5%, as compared with the alternative design of uniform conducting lines. In the specific example as shown in FIG. 8A, the first layer deep line 862D in the low resistivity portion and the first layer shallow line 868S in the low capacitivity portion are in the seventh metal layer M6. The reduction of the time delay due to the first layer deep line 862D and the first layer shallow line 868S is 1.8%, as compared with the alternative design of uniform conducting lines.

In the specific example as shown in FIG. 8A, the deep line 852D and the shallow line 858S are in the sixth metal layer M5. The reduction of the time delay due to the deep line 852D and the shallow line 858S is 0.2%, as compared with the alternative design of uniform conducting lines. In the specific example as shown in FIG. 8A, the deep line 842D and the shallow line 848S are in the fifth metal layer M4. The reduction of the time delay due to the deep line 842D and the shallow line 848S is 0.4%, as compared with the alternative design of uniform conducting lines. In the specific example as shown in FIG. 8A, the deep line 832D and the shallow line 838S are in the fourth metal layer M3. The reduction of the time delay due to the deep line 832D and the shallow line 838S is 0.4%, as compared with the alternative design of uniform conducting lines. In the specific example as shown in FIG. 8A, the deep line 822D and the shallow line 828S are in the third metal layer M2. The reduction of the time delay due to the deep line 822D and the shallow line 828S is 1.1%, as compared with the alternative design of uniform conducting lines.

In the embodiments as shown in FIG. 8A, the reduction of the time delay of the signal propagation in the first conducting path includes the contributions from the time delay reductions in metal layers M7, M6, M5, M4, M3, and M2. In some embodiments, such as in the specific example in FIG. 8B, the reduction of the time delay of the signal propagation in the first conducting path is dominated by the time delay reductions in the first conductive layer and in the second conductive layer, when the low resistivity portion and the low capacitivity portion of the first conducting path implemented in the first conductive layer and the second conductive layer have a total length much larger than the total length of the conducting lines for the same path in all other conductive layers. In FIG. 8B, the first conductive layer is in the ninth metal layer M8, and the second conductive layer is in the tenth metal layer M9.

In FIG. 8B, the first conducting path from the first active device D1 to the second active device D2 includes a low resistivity portion and a low capacitivity portion. The low resistivity portion of the first conducting path includes a first layer deep line 882D in the ninth metal layer M8 and a second layer deep line 892D in the tenth metal layer M9. The first layer deep line 882D and the second layer deep line 892D are electrically connected together through the via-connector 8V89. The first layer deep line 882D in the low resistivity portion is electrically connected to the output of the first active device D1 through the via-connector 8V78 and through other via-connectors/conducting lines in various metal layers (from M0 to M7). The low capacitivity portion of the first conducting path includes a first layer shallow line 888S in the ninth metal layer M8 and a second layer shallow line 898S in the tenth metal layer M9. The first layer shallow line 888S and the second layer shallow line 898S are electrically connected together through the via-connector 8V98. The first layer shallow line 888S in the low capacitivity portion is electrically connected to the input of the second active device D2 through the via-connector 8V87 and through other via-connectors/conducting lines in various metal layers (from M0 to M7).

In FIG. 8B, the low resistivity portion of the first conducting path is electrically connected with the low capacitivity portion of the first conducting path through the second layer conducting line 894. In some embodiments, the second layer conducting line 894 is a second layer deep line. In some embodiments, the second layer conducting line 894 is a second layer shallow line. In some embodiments, the second layer conducting line 894 is a second layer uniform line. The second layer conducting line 894 is a fan-out node. The first conducting path (which is from the first active device D1 to the second active device D2) and the second conducting path (which is from the first active device D1 to the third active device D3) branch out from each other at the fan-out node (i.e., the second layer conducting line 894).

In FIG. 8B, the second conducting path also includes a low resistivity portion and a low capacitivity portion. The low resistivity portion is between the first active device D1 and the second layer conducting line 894. The low capacitivity portion is between the second layer conducting line 894 and the third active device D3. The low resistivity portion of the second conducting path includes the first layer deep line 882D and the second layer deep line 892D. The low capacitivity portion of the second conducting path includes a first layer shallow line 886S and a second layer shallow line 896S electrically connected together through a corresponding via-connector.

In FIG. 8B, when the first conducting path from the first active device D1 to the second active device D2 is implemented with a low resistivity portion and a low capacitivity portion, the time delay of the signal propagation along the first conducting path is reduced. In the specific example as shown in FIG. 8B, the reduction of the time delay of the signal propagation in the first conducting path is dominated by the time delay reductions in the ninth metal layer M8 and in the tenth metal layer M9. In the specific example as shown in FIG. 8B, the reduction of the time delay due to the first layer deep line 882D and the first layer shallow line 888S in the ninth metal layer M8 is 2.8%, as compared with the alternative design of uniform conducting lines. In the specific example as shown in FIG. 8B, the reduction of the time delay due to the second layer deep line 892D and the second layer shallow line 898S in the tenth metal layer M9 is 2.0%, as compared with the alternative design of uniform conducting lines. In the specific example as shown in FIG. 8B, the total time delay of the signal propagation in the first conducting path is reduced by 4.7%, as compared with an alternative design in which all conducting lines in the first conducting path are implemented as uniform lines.

In some embodiments, when the total length of the first conducting path from the first active device D1 to the second active device D2 is smaller than a predetermined distance, each of the conducting lines in the first conducting path is implemented as a deep line. In some embodiments, the value of the predetermined distance that is used by the APR program is set by the user. In some embodiments, the value of the predetermined distance that is used by the APR program is read from a database or a technology file.

Figure 9:
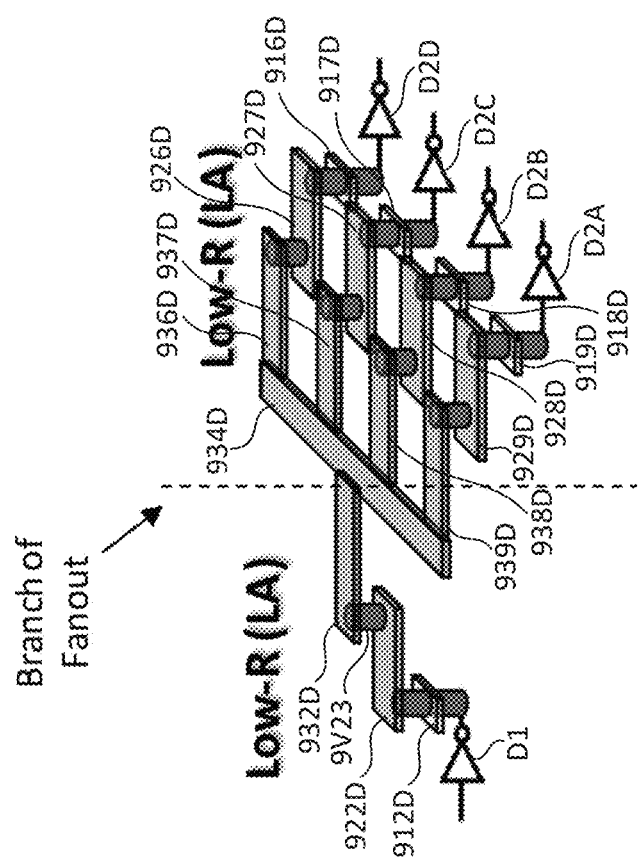
FIG. 9 is a layout diagram of an integrated circuit having multiple signal conducting paths formed with deep lines, in accordance with some embodiments.

In some embodiments, as shown in FIG. 9, the output of the first active device D1 is electrically coupled to multiple receiving devices (such as D2A, D2B, D2C, and D2D). In some embodiments, when the total length of a conducting path from the first active device D1 to each receiving device (such as D2A, D2B, D2C, or D2D) is smaller than a predetermined distance, the conducting lines in all of the conducting paths from the output of the first active device D1 to the multiple receiving devices D2A-D2D are implemented with deep lines in at least two conductive layers. In FIG. 9, the conducting paths from the first active device D1 to the multiple receiving devices D2A-D2D breach out at the fan-out node, which is the conducting line 934D. The common portion of the conducting paths from first active device D1 to the multiple receiving devices D2A-D2D is from the output of the first active device D1 to the conducting line 934D.

In FIG. 9, the common portion of the conducting paths includes the first layer deep line 922D in the third metal layer M2 and the second layer deep line 932D in the fourth metal layer M3. The first layer deep line 922D and the second layer deep line 932D are electrically connected together through the via-connector 9V23. The first layer deep line 922D is electrically connected to the output of the first active device D1 though various via-connectors and various conducting lines (which include the deep line 912D in the second metal layer MD. The common portion of the conducting paths is electrically connected to the branched path to each receiving device (such as D2A, D2B, D2C, or D2D) through the conducting line 934D. In FIG. 9, the conducting line 934D is implemented as a deep line in the fourth metal layer M3.

In FIG. 9, the branched path to each receiving device (such as D2A, D2B, D2C, or D2D) includes a deep line (correspondingly 929D, 928D, 927D, or 926D) in the third metal layer M2 and a deep line (correspondingly 939D, 938D, 937D, or 936D) in the fourth metal layer M3. Each of the deep lines 939D, 938D, 937D, and 936D is electrically connected between the fan-out node (i.e., the conducting line 934D) and one of the corresponding deep lines 929D, 928D, 927D, or 926D. Each of the deep lines 929D, 928D, 927D, and 926D is electrically connected to the input of one of the corresponding receiving devices D2A, D2B, D2C, or D2D through various via-connectors and various conducting lines (such as through one of the corresponding deep lines 919D, 918D, 917D, or 916D in the second metal layer M1).

In FIG. 9, when the total length of the deep lines in the metal layers M2 and M3 for the conducting path from the first active device D1 to a receiving device (such as D2A, D2B, D2C, or D2D) is longer than the total length of the conducting lines for the same conducting path in all other conductive layers, the reduction of the time delay of the signal propagation in the conducting path to each receiving device is dominated by the time delay reductions in the third metal layer M2 and in the fourth metal layer M3.

In the specific example as shown in FIG. 9, the reduction of the time delay due to the deep line 922D in the third metal layer M2 is 2.7%, and the reduction of the time delay due to the deep line 932D in the fourth metal layer M3 is 1.1%, as compared with the alternative design of uniform conducting lines. In the specific example as shown in FIG. 9, the reduction of the time delay due to the deep line (929D, 928D, 927D, or 926D) in the third metal layer M2 on a branched path is 0.2%, and the reduction of the time delay due to the deep line (939D, 938D, 937D, or 936D) in the fourth metal layer M3 on a branched path is −0.3%, as compared with the alternative design of uniform conducting lines. In the specific example as shown in FIG. 9, the total time delay of the signal propagation in the conducting path from the first active device D1 to one of the receiving devices (such as D2A, D2B, D2C, or D2D) is reduced by 3.7%, as compared with an alternative design in which all conducting lines in the conducting path are implemented as uniform lines.

Figure 10:
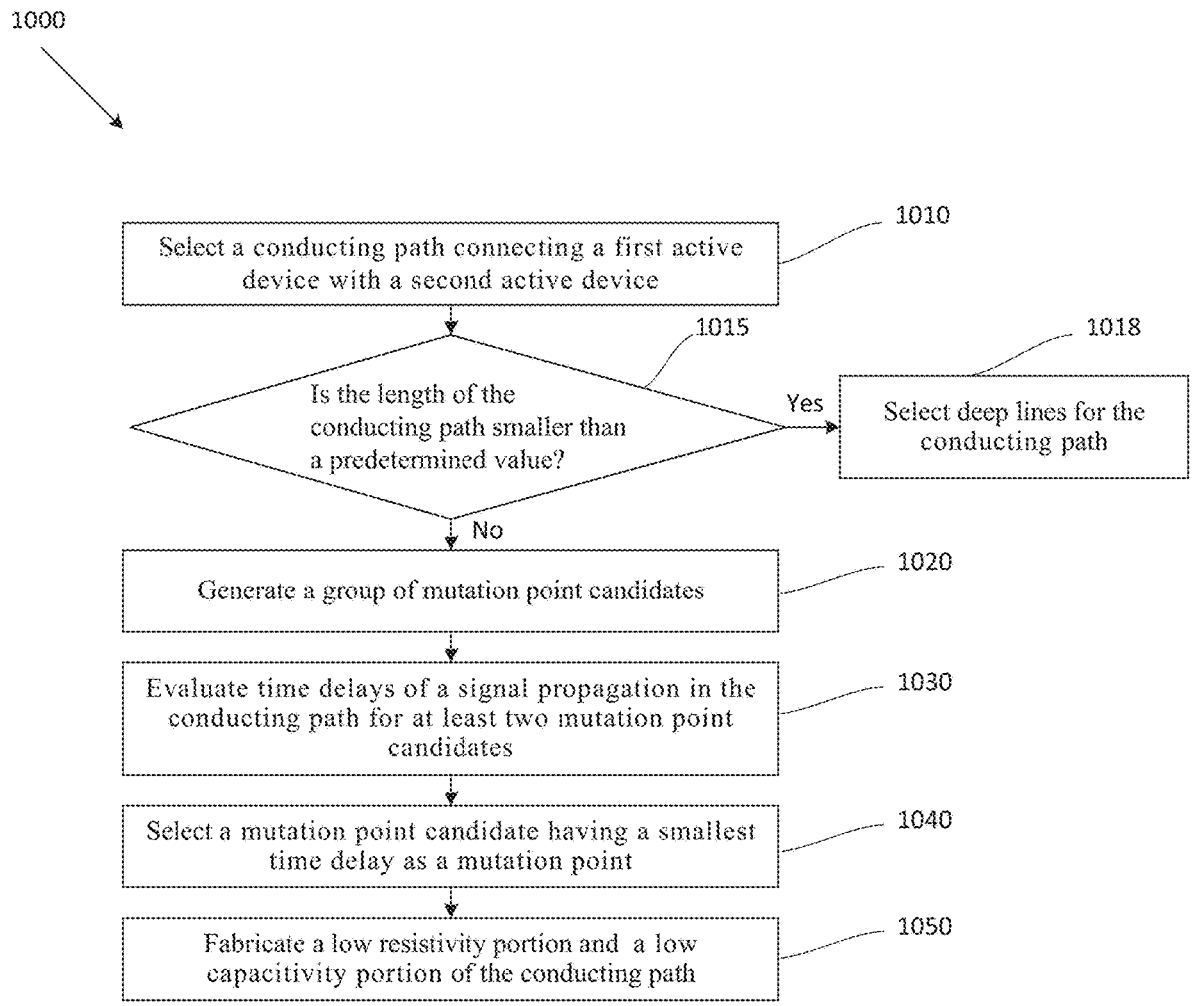
FIG. 10 is a flowchart of a method of manufacturing an integrated circuit, in accordance with some embodiments.

FIG. 10 is a flowchart of a method 1000 of manufacturing an integrated circuit, in accordance with some embodiments. The sequence in which the operations of method 1000 are depicted in FIG. 10 is for illustration only; the operations of method 1000 are capable of being executed in sequences that differ from that depicted in FIG. 10. It is understood that additional operations may be performed before, during, and/or after the method 1000 depicted in FIG. 10, and that some other processes may only be briefly described herein.

In operation 1010 of method 1000, a conducting path connecting a first active with a second active device is selected. In some embodiments, the selected conducting path is selected for speed improvements, because the selected conducting path has a delay time that is longer than a critical delay time if the selected conducting path is implemented with uniform lines.

In operation 1015 of method 1000, the length the conducting path is compared in an APR program with a predetermined value. If the length the conducting path is smaller than the predetermined value, the process flow of method 1000 proceeds to operation 1018. On the other hand, if the length the conducting path is not smaller than the predetermined value, the process flow of method 1000 proceeds to operation 1020.

In operation 1018 of method 1000, which follows the flow of the decision "YES" from operation 1015, deep lines are selected for the conducting path in at least two conductive layers. In the example embodiments of FIG. 9, when the total length of a conducting path from the first active device D1 to each receiving device (such as D2A, D2B, D2C, or D2D) is smaller than a predetermined distance, the conducting lines in the metal layers M2 and M3 for all of the conducting paths from the output of the first active device D1 to the multiple receiving devices D2A-D2D are implemented with deep lines.

In operation 1020 of method 1000, which follows the flow of the decision "NO" from operation 1015, a group of mutation point candidates is generated. In the example embodiments of FIGS. 6A-6F, the group of mutation point candidates include the via-connectors 6V1, 6V2, 6V3, 6V4, 6V5, and 6V6. In some example embodiments, one or more mutation point candidates is at a fan-out node. Examples of the fan-out node include the second layer deep line 525D in FIG. 7, the second layer conducting line 874 in FIG. 8A, or the second layer conducting line 894 in FIG. 8B.

In operation 1030 of method 1000, evaluating time delays of a signal propagation in the conducting path for at least two mutation point candidates are evaluated. In the example embodiments of FIGS. 6A-6F, the time delay of a signal propagation in the conducting path is evaluated for each of the situations when one of the via-connectors 6V1, 6V2, 6V3, 6V4, 6V5, and 6V6 is selected as the mutation point 6MP. In some embodiments, only some of the via-connectors 6V1, 6V2, 6V3, 6V4, 6V5, and 6V6 are evaluated for implementing as the mutation point 6MP.

In operation 1040 of method 1000, a mutation point candidate having a smallest time delay is selected as a mutation point, based on time delays obtained in operation 1030. In the example embodiments of FIGS. 6A-6F, after each of the via-connectors 6V1, 6V2, 6V3, 6V4, 6V5, and 6V6 are evaluated for implementing as the mutation point 6MP, the mutation point candidate that has the smallest time delay is selected. In one example, when the via-connectors 6V4 is selected as the mutation point 6MP, the conducting path from the first active device D1 to the second active device D2 has the smallest time delay. In the example embodiments of FIGS. 8A-8B, the selected mutation point is at a fan-out node (i.e., the second layer conducting line 874 in FIG. 8A, or the second layer conducting line 894 in FIG. 8B).

In some embodiments, after the mutation point is selected, the layout patterns for a low resistivity portion of the conducting path and the layout patterns for a low capacitivity portion of the conducting path are generated by an APR program. Then, the process flow proceeds to operation 1050.

In operation 1050 of method 1000, a low resistivity portion and a low capacitivity portion of the conducting path are fabricated. The low resistivity portion of the conducting path includes one or more deep lines between the output of the first active device and the mutation point. The low capacitivity portion of the conducting path includes one or more shallow lines between the mutation point and the input of the second active device. In the example embodiments of FIG. 6D, the low resistivity portion 601D fabricated in operation 1050 includes the first layer deep line 512D, the second layer deep line 523D, the first layer deep line 514D, and the second layer deep line 525D. In the example embodiments of FIG. 6D, the low capacitivity portion 602D fabricated in operation 1050 includes the first layer shallow line 517S, the second layer shallow line 527S, and the first layer shallow line 518S. In the example embodiments of FIG. 6D, the low resistivity portion 601D is between the output of the first active device D1 and the mutation point 6MP, and the low capacitivity portion 602D is between the mutation point 6MP and the input of the second active device D2.

Figure 11:
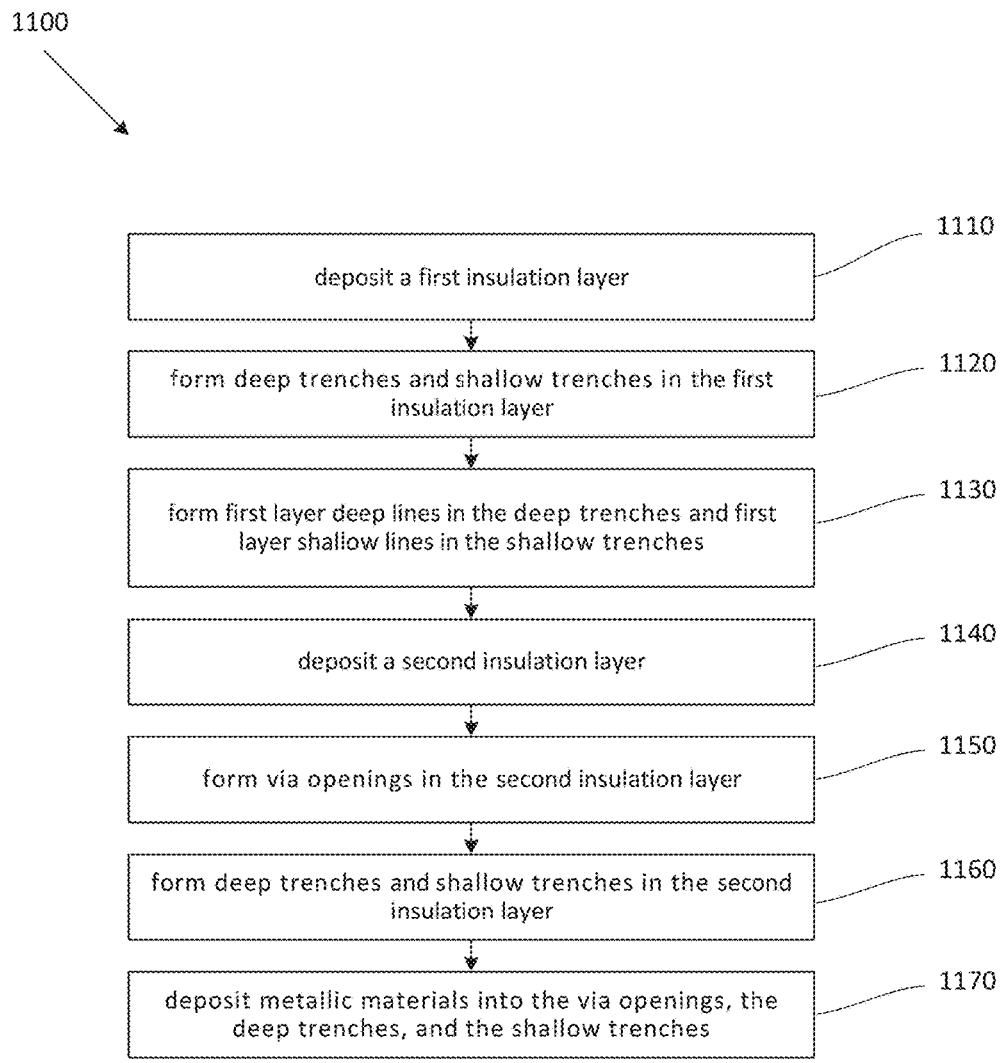
FIG. 11 is a flowchart of a method of fabricating deep lines and shallow lines, in accordance with some embodiments.

FIG. 11 is a flowchart of a method 1100 of fabricating at least one deep line and at least one shallow line, in accordance with some embodiments. The sequence in which the operations of method 1100 are depicted in FIG. 11 is for illustration only; the operations of method 1100 are capable of being executed in sequences that differ from that depicted in FIG. 11. It is understood that additional operations may be performed before, during, and/or after the method 1100 depicted in FIG. 11, and that some other processes may only be briefly described herein.

FIGS. 12A-12E are cross-sectional views of example device structures fabricated during the operations of the method 1100, in accordance with some embodiments. The cross-sectional views of the integrated circuit in FIG. 6F within the cutting planes MM' and NN' (correspondingly specified by the lines MM' and NN' in FIG. 6F) are depicted in FIG. 12E. In the cross-sectional view in the cutting plane NN' of FIG. 12E, the first layer shallow line 518S and the first layer deep lines 517D-519D embedded in the interlayer dielectric 210 are fabricated above an insulation layer 205. The depth of each first layer deep line (e.g., 517D, 518D, 519D) is larger than the depth of the first layer shallow line 518S. The interlayer dielectric 220 is deposited above the interlayer dielectric 210 and above the first layer deep lines and the first layer shallow lines. The second layer deep line 527D extending along the Y-direction is embedded in the interlayer dielectric 220. Furthermore, the second layer deep line 527D is electrically connected to the first layer shallow line 518S through the via-connector 6V6 and electrically connected to the first layer deep line 517D through the via-connector 6V5.

In the cross-sectional view in the cutting plane MM' of FIG. 12E, the first layer shallow line 518S embedded in the interlayer dielectric 210 is fabricated above the insulation layer 205. The interlayer dielectric 220 is deposited above the interlayer dielectric 210 and above the first layer shallow line 518S. The second layer shallow lines 526S-527S and the second layer deep lines 527D-528D are fabricated in the interlayer dielectric 220 above the interlayer dielectric 210. Furthermore, the second layer deep line 527D is electrically connected to the first layer shallow line 518S through the via-connector 6V6.

The method 1100 in FIG. 11 includes operations 1110, 1120, 1130, 1140, 1150, 1160, and 1170. In operation 1110 of method 1100, a first insulation layer is deposited on another base insulation layer. In some embodiments, the deposition processes include chemical vapor deposition (CVD), physical vapor deposition (PVD), atomic layer deposition (ALD), sputtering or another suitable deposition process. In some embodiments, the base insulation layer is a top insulation layer fabricated in the front-end-of-line (FEOL) process. In some embodiments, the base insulation layer is one of the interlayer dielectric (ILD) layers fabricated after the FEOL process. In one example embodiment, as shown in FIG. 12A, the interlayer dielectric 210 is deposited atop the insulation layer 205.

In operation 1120 of method 1100, deep trenches and shallow trenches are formed in the first insulation layer. In some embodiments, the patterns of the deep trenches and the shallow trenches are defined by a mask layer fabricated above the first insulation layer with lithography techniques. In some embodiments, the etching processes for forming the deep trenches and the shallow trenches include deep reactive-ion etching or another suitable etching process. In one example embodiment, as shown in FIG. 12A, shallow trench 1218S and deep trenches 1217D-1219D are formed in the interlayer dielectric 210.

In operation 1130 of method 1100, first layer deep lines are formed in the deep trenches and first layer shallow lines are formed in the shallow trenches. In some embodiments, metallic materials are deposited into the deep trenches and the shallow trenches, and followed by a polish process, such as chemical mechanical polishing (CMP) process, for planarization and for removing the excess metallic materials. In some embodiments, the deposition processes for metallic materials include chemical vapor deposition (CVD), physical vapor deposition (PVD), atomic layer deposition (ALD), sputtering or another suitable deposition process. In one example embodiment, as shown in FIG. 12B, after metallic materials are deposited into the shallow trench 1218S and the deep trenches 1217D-1219D (as shown in FIG. 12A), the first layer shallow line 518S and the first layer deep lines 517D-519D are formed in the interlayer dielectric 210.

In operation 1140 of method 1100, a second insulation layer is deposited above the first insulation layer. In some embodiments, the deposition processes include chemical vapor deposition (CVD), physical vapor deposition (PVD), atomic layer deposition (ALD), sputtering or another suitable deposition process. In one example embodiment, as shown in FIG. 12C, the interlayer dielectric 210 is deposited atop the interlayer dielectric 210.

In operation 1150 of method 1100, via openings are formed in the second insulation layer. In operation 1160 of method 1100, deep trenches and shallow trenches are formed in the second insulation layer. In some embodiments, the via openings, the deep trenches, and the shallow trenches are formed in multiple steps of pattern formation processes and etching processes. In some embodiments, pattern formation processes includes forming a mask layer above the second insulation layer with lithography techniques. In some embodiments, the etching processes for forming via openings, the deep trenches, and the shallow trenches include deep reactive-ion etching or another suitable etching process. In one example embodiment, as shown in FIG. 12D, the via openings 12V5-12V6, the shallow trenches 1226S-1227S, and the deep trenches 1227D-1228D are formed in the interlayer dielectric 220.

In operation 1170 of method 1100, metallic materials are deposited into the via openings, the deep trenches, and the shallow trenches, whereby second layer deep lines and second layer shallow lines are correspondingly formed in the deep trenches and the shallow trenches in the second insulation layer. In one example embodiment, as shown in FIG. 12E, after metallic materials are deposited into the via openings 12V5-12V6 (in FIG. 12D) and deposited into the shallow trenches 1226S-1227S and the deep trenches 1227D-1228D (in FIG. 12D), the second layer shallow lines 526S-527S and the second layer deep lines 527D-528D are formed in the interlayer dielectric 220. In addition, the via-connector 6V5 is formed connecting the second layer deep line 527D with the first layer deep line 517D, and the via-connector 6V5 is formed connecting the second layer deep line 527D with the first layer shallow line 518S.

Figure 13:
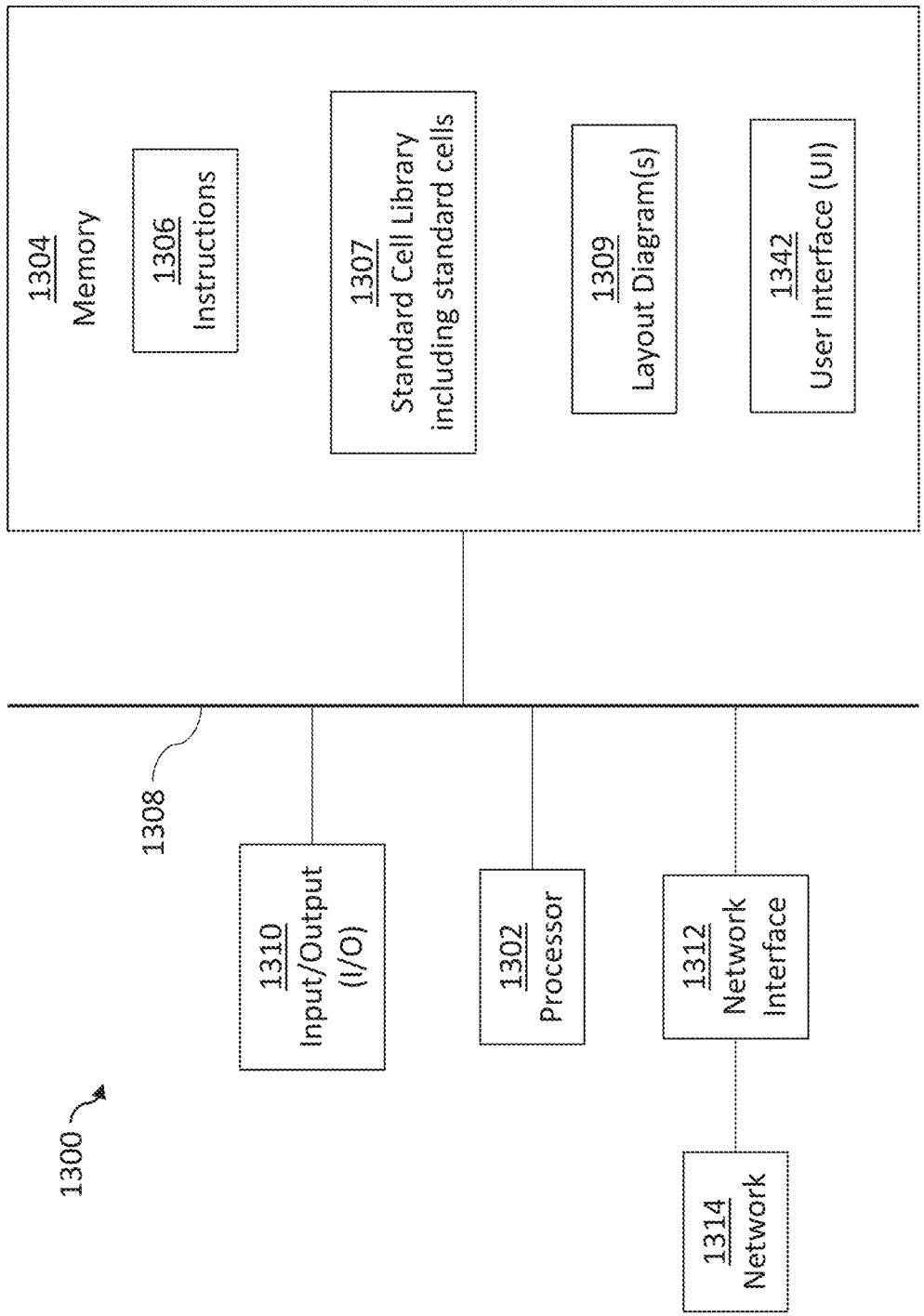
FIG. 13 is a block diagram of an electronic design automation (EDA) system, in accordance with some embodiments.

FIG. 13 is a block diagram of an electronic design automation (EDA) system 1300 in accordance with some embodiments.

In some embodiments, EDA system 1300 includes an APR system. Methods described herein of designing layout diagrams represent wire routing arrangements, in accordance with one or more embodiments, are implementable, for example, using EDA system 1300, in accordance with some embodiments.

In some embodiments, EDA system 1300 is a general purpose computing device including a hardware processor 1302 and a non-transitory, computer-readable storage medium 1304. Storage medium 1304, among other things, is encoded with, i.e., stores, computer program code 1306, i.e., a set of executable instructions. Execution of instructions 1306 by hardware processor 1302 represents (at least in part) an EDA tool which implements a portion or all of the methods described herein in accordance with one or more embodiments (hereinafter, the noted processes and/or methods).

Processor 1302 is electrically coupled to computer-readable storage medium 1304 via a bus 1308. Processor 1302 is also electrically coupled to an I/O interface 1310 by bus 1308. A network interface 1312 is also electrically connected to processor 1302 via bus 1308. Network interface 1312 is connected to a network 1314, so that processor 1302 and computer-readable storage medium 1304 are capable of connecting to external elements via network 1314. Processor 1302 is configured to execute computer program code 1306 encoded in computer-readable storage medium 1304 in order to cause system 1300 to be usable for performing a portion or all of the noted processes and/or methods. In one or more embodiments, processor 1302 is a central processing unit (CPU), a multi-processor, a distributed processing system, an application specific integrated circuit (ASIC), and/or a suitable processing unit.

In one or more embodiments, computer-readable storage medium 1304 is an electronic, magnetic, optical, electromagnetic, infrared, and/or a semiconductor system (or apparatus or device). For example, computer-readable storage medium 1304 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1304 includes a compact disk-read only memory (CD-ROM), a compact disk-read/write (CD-R/W), and/or a digital video disc (DVD).

In one or more embodiments, storage medium 1304 stores computer program code 1306 configured to cause system 1300 (where such execution represents (at least in part) the EDA tool) to be usable for performing a portion or all of the noted processes and/or methods. In one or more embodiments, storage medium 1304 also stores information which facilitates performing a portion or all of the noted processes and/or methods. In one or more embodiments, storage medium 1304 stores library 1307 of standard cells including such standard cells as disclosed herein. In one or more embodiments, storage medium 1304 stores one or more layout diagrams 1309 corresponding to one or more layouts disclosed herein.

EDA system 1300 includes I/O interface 1310. I/O interface 1310 is coupled to external circuitry. In one or more embodiments, I/O interface 1310 includes a keyboard, keypad, mouse, trackball, trackpad, touchscreen, and/or cursor direction keys for communicating information and commands to processor 1302.

EDA system 1300 also includes network interface 1312 coupled to processor 1302. Network interface 1312 allows system 1300 to communicate with network 1314, to which one or more other computer systems are connected. Network interface 1312 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1300.

System 1300 is configured to receive information through I/O interface 1310. The information received through I/O interface 1310 includes one or more of instructions, data, design rules, libraries of standard cells, and/or other parameters for processing by processor 1302. The information is transferred to processor 1302 via bus 1308. EDA system 1300 is configured to receive information related to a UI through I/O interface 1310. The information is stored in computer-readable medium 1304 as user interface (UI) 1342.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1300. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 14:
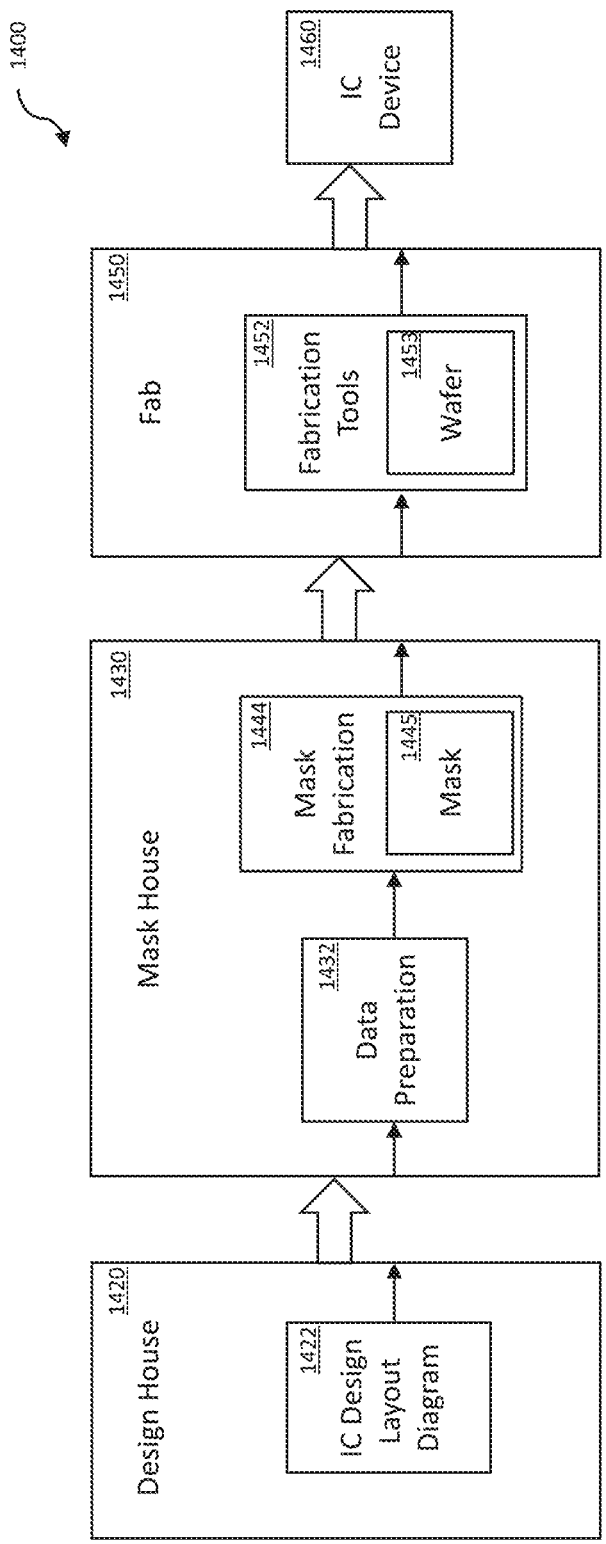
FIG. 14 is a block diagram of an integrated circuit (IC) manufacturing system, and an IC manufacturing flow associated therewith, in accordance with some embodiments.

FIG. 14 is a block diagram of an integrated circuit (IC) manufacturing system 1400, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1400.

In FIG. 14, IC manufacturing system 1400 includes entities, such as a design house 1420, a mask house 1430, and an IC manufacturer/fabricator ("fab") 1450, that interact with one another in the design, development, and manufacturing cycles and/or services related to manufacturing an IC device 1460. The entities in system 1400 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1420, mask house 1430, and IC fab 1450 is owned by a single larger company. In some embodiments, two or more of design house 1420, mask house 1430, and IC fab 1450 coexist in a common facility and use common resources.

Design house (or design team) 1420 generates an IC design layout diagram 1422. IC design layout diagram 1422 includes various geometrical patterns designed for an IC device 1460. The geometrical patterns correspond to patterns of metal, oxide, or semiconductor layers that make up the various components of IC device 1460 to be fabricated. The various layers combine to form various IC features. For example, a portion of IC design layout diagram 1422 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1420 implements a proper design procedure to form IC design layout diagram 1422. The design procedure includes one or more of logic design, physical design or place and route. IC design layout diagram 1422 is presented in one or more data files having information of the geometrical patterns. For example, IC design layout diagram 1422 can be expressed in a GDSII file format or DFII file format.

Mask house 1430 includes data preparation 1432 and mask fabrication 1444. Mask house 1430 uses IC design layout diagram 1422 to manufacture one or more masks 1445 to be used for fabricating the various layers of IC device 1460 according to IC design layout diagram 1422. Mask house 1430 performs mask data preparation 1432, where IC design layout diagram 1422 is translated into a representative data file (RDF). Mask data preparation 1432 provides the RDF to mask fabrication 1444. Mask fabrication 1444 includes a mask writer. A mask writer converts the RDF to an image on a substrate, such as a mask (reticle) 1445 or a semiconductor wafer 1453. The design layout diagram 1422 is manipulated by mask data preparation 1432 to comply with particular characteristics of the mask writer and/or requirements of IC fab 1450. In FIG. 14, mask data preparation 1432 and mask fabrication 1444 are illustrated as separate elements. In some embodiments, mask data preparation 1432 and mask fabrication 1444 can be collectively referred to as mask data preparation.

In some embodiments, mask data preparation 1432 includes optical proximity correction (OPC) which uses lithography enhancement techniques to compensate for image errors, such as those that can arise from diffraction, interference, other process effects and the like. OPC adjusts IC design layout diagram 1422. In some embodiments, mask data preparation 1432 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1432 includes a mask rule checker (MRC) that checks the IC design layout diagram 1422 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1422 to compensate for limitations during mask fabrication 1444, which may undo part of the modifications performed by OPC in order to meet mask creation rules.

In some embodiments, mask data preparation 1432 includes lithography process checking (LPC) that simulates processing that will be implemented by IC fab 1450 to fabricate IC device 1460. LPC simulates this processing based on IC design layout diagram 1422 to create a simulated manufactured device, such as IC device 1460. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1422.

It should be understood that the above description of mask data preparation 1432 has been simplified for the purposes of clarity. In some embodiments, data preparation 1432 includes additional features such as a logic operation (LOP) to modify the IC design layout diagram 1422 according to manufacturing rules. Additionally, the processes applied to IC design layout diagram 1422 during data preparation 1432 may be executed in a variety of different orders.

After mask data preparation 1432 and during mask fabrication 1444, a mask 1445 or a group of masks 1445 are fabricated based on the modified IC design layout diagram 1422. In some embodiments, mask fabrication 1444 includes performing one or more lithographic exposures based on IC design layout diagram 1422. In some embodiments, an electron-beam (e-beam) or a mechanism of multiple e-beams is used to form a pattern on a mask (photomask or reticle) 1445 based on the modified IC design layout diagram 1422. Mask 1445 can be formed in various technologies. In some embodiments, mask 1445 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1445 includes a transparent substrate (e.g., fused quartz) and an opaque material (e.g., chromium) coated in the opaque regions of the binary mask. In another example, mask 1445 is formed using a phase shift technology. In a phase shift mask (PSM) version of mask 1445, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1444 is used in a variety of processes. For example, such a mask(s) is used in an ion implantation process to form various doped regions in semiconductor wafer 1453, in an etching process to form various etching regions in semiconductor wafer 1453, and/or in other suitable processes.

IC fab 1450 is an IC fabrication business that includes one or more manufacturing facilities for the fabrication of a variety of different IC products. In some embodiments, IC Fab 1450 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1450 includes fabrication tools 1452 configured to execute various manufacturing operations on semiconductor wafer 1453 such that IC device 1460 is fabricated in accordance with the mask(s), e.g., mask 1445. In various embodiments, fabrication tools 1452 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1450 uses mask(s) 1445 fabricated by mask house 1430 to fabricate IC device 1460. Thus, IC fab 1450 at least indirectly uses IC design layout diagram 1422 to fabricate IC device 1460. In some embodiments, semiconductor wafer 1453 is fabricated by IC fab 1450 using mask(s) 1445 to form IC device 1460. In some embodiments, the IC fabrication includes performing one or more lithographic exposures based at least indirectly on IC design layout diagram 1422. Semiconductor wafer 1453 includes a silicon substrate or other proper substrate having material layers formed thereon. Semiconductor wafer 1453 further includes one or more of various doped regions, dielectric features, multi-level interconnects, and the like (formed at subsequent manufacturing steps).

Details regarding an integrated circuit (IC) manufacturing system (e.g., system 1400 of FIG. 14), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

An aspect of the present disclosure relates to an integrated circuit. The integrated circuit includes a plurality of first layer deep lines and a plurality of first layer shallow lines. Each of the first layer deep lines and the first layer shallow lines is in a first conductive layer above transistors on a substrate. The integrated circuit also includes a plurality of second layer deep lines and a plurality of second layer shallow lines. Each of the second layer deep lines and the second layer shallow lines is in a second conductive layer above the first conductive layer.

Another aspect of the present disclosure still relates to an integrated circuit. The integrated circuit includes a plurality of first layer deep lines and a plurality of first layer shallow lines. Each of the first layer deep lines and the first layer shallow lines is in a first conductive layer. The integrated circuit also includes a conducting path having a low resistivity portion and a low capacitivity portion. The low resistivity portion is coupled to an output of a first active device. The low capacitivity portion is coupled to an input of a second active device. The low resistivity portion includes at least one first layer deep line and excludes the first layer shallow lines. The low capacitivity portion includes at least one first layer shallow line and excludes the first layer deep lines.

Another aspect of the present disclosure relates to a method. The method includes fabricating first layer deep lines and first layer shallow lines extending in a first direction in a first insulation layer. The method also includes fabricating via-connectors, second layer deep lines, and second layer shallow lines in a second insulation layer. The second layer deep lines and the second layer shallow lines extend in a second direction perpendicular to the first direction. One of the via-connectors either connects one of the second layer deep lines with one of the first layer shallow lines or connects one of the second layer shallow lines with one of the first layer deep lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
a plurality of first layer deep lines and a plurality of first layer shallow lines, wherein each of the first layer deep lines and the first layer shallow lines is in a first conductive layer above transistors on a substrate;
a plurality of second layer deep lines and a plurality of second layer shallow lines, wherein each of the second layer deep lines and the second layer shallow lines is in a second conductive layer above the first conductive layer;
a conducting path having a low resistivity portion and a low capacitivity portion connected together through a via-connector between the first conductive layer and the second conductive layer;
wherein the low resistivity portion includes at least one first layer deep line or at least one second layer deep line and excludes the first layer shallow lines and the second layer shallow lines; and wherein the low capacitivity portion includes at least one first layer shallow line or at least one second layer shallow line and excludes the first layer deep lines and the second layer deep lines.

2. The integrated circuit of claim 1, wherein the low resistivity portion is coupled to an output of a first active device, and wherein the low capacitivity portion is coupled to an input of a second active device.

3. The integrated circuit of claim 2, wherein:
the low resistivity portion includes at least one first layer deep line and at least one second layer deep line; and
the low capacitivity portion includes at least one first layer shallow line and at least one second layer shallow line.

4. The integrated circuit of claim 1, further comprising:
a third active device on the substrate;
a branched conducting path between a fan-out node and an input of the third active device; and
wherein the branched conducting path includes at least another first layer shallow line or another second layer shallow line and excludes the first layer deep lines and the second layer deep lines.

5. The integrated circuit of claim 1, further comprising:
a plurality of third layer deep lines and a plurality of third layer shallow lines, wherein each of the third layer deep lines and the third layer shallow lines is in a third conductive layer.

6. The integrated circuit of claim 5, wherein the third conductive layer is above the second conductive layer.

7. The integrated circuit of claim 5, wherein the third conductive layer is between the first conductive layer and the second conductive layer.

8. The integrated circuit of claim 5, wherein the third conductive layer is above the transistors but underneath the first conductive layer.

9. The integrated circuit of claim 1, further comprising:
a plurality of conducting lines in a third conductive layer between the first conductive layer and the second conductive layer.

10. An integrated circuit comprising:
a plurality of first layer deep lines and a plurality of first layer shallow lines, wherein each of the first layer deep lines and the first layer shallow lines is in a first conductive layer;
a conducting path having a low resistivity portion and a low capacitivity portion, wherein the low resistivity portion is coupled to an output of a first active device, and wherein the low capacitivity portion is coupled to an input of a second active device;
wherein the low resistivity portion includes at least one first layer deep line and excludes the first layer shallow lines;
wherein the low capacitivity portion includes at least one first layer shallow line and excludes the first layer deep lines; and
wherein the low resistivity portion and the low capacitivity portion is connected at a fan-out node.

11. The integrated circuit of claim 10, further comprising:
a plurality of second layer deep lines and a plurality of second layer shallow lines, wherein each of the second layer deep lines and the second layer shallow lines is in a second conductive layer above the first conductive layer;
wherein the low resistivity portion also includes at least one second layer deep line and excludes the second layer shallow lines; and wherein the low capacitivity portion also includes at least one second layer shallow line and excludes the second layer deep lines.

12. The integrated circuit of claim 11, further comprising: a plurality of third layer deep lines and a plurality of third layer shallow lines, wherein each of the third layer deep lines and the third layer shallow lines is in a third conductive layer.

13. The integrated circuit of claim 12, wherein the third conductive layer is above the second conductive layer.

14. The integrated circuit of claim 12, wherein the third conductive layer is between the first conductive layer and the second conductive layer.

15. The integrated circuit of claim 12, wherein the third conductive layer is underneath the first conductive layer.

16. The integrated circuit of claim 11, further comprising: a plurality of conducting lines in a third conductive layer between the first conductive layer and the second conductive layer.

17. A method comprising:
fabricating first layer deep lines and first layer shallow lines extending in a first direction in a first insulation layer;
fabricating via-connectors, second layer deep lines, and second layer shallow lines in a second insulation layer, wherein the second layer deep lines and the second layer shallow lines extend in a second direction perpendicular to the first direction; and
wherein one of the via-connectors either connects one of the second layer deep lines with one of the first layer shallow lines or connects one of the second layer shallow lines with one of the first layer deep lines.

18. The method of claim 17, further comprising:
forming deep trenches for the first layer deep lines and shallow trenches for the first layer shallow lines in the first insulation layer.

19. The method of claim 17, further comprising:
forming via openings in the second insulation layer for the via-connectors; and
forming deep trenches for the second layer deep lines and shallow trenches for the second layer shallow lines in the second insulation layer.

20. The method of claim 19, further comprising:
depositing metallic materials into the via openings, the deep trenches, and the shallow trenches.

* * * * *